(12) United States Patent
Kim et al.

(10) Patent No.: US 10,042,482 B2
(45) Date of Patent: Aug. 7, 2018

(54) TOUCH CONTROLLER HAVING INCREASED SENSING SENSITIVITY, AND DISPLAY DRIVING CIRCUIT AND DISPLAY DEVICE AND SYSTEM HAVING THE TOUCH CONTROLLER

(75) Inventors: Hyoung-rae Kim, Hwaseong-si (KR); Yoon-kyung Choi, Yongin-si (KR); Hwa-hyun Cho, Seoul (KR); Sang-woo Kim, Suwon-si (KR); Hae-yong Ahn, Seoul (KR); Hyung-dal Kwon, Suwon-si (KR); Jong-kang Park, Suwon-si (KR); San-ho Byun, Bucheon-si (KR); Jae-suk Yu, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 837 days.

(21) Appl. No.: 13/477,176

(22) Filed: May 22, 2012

(65) Prior Publication Data
US 2012/0229421 A1    Sep. 13, 2012

Related U.S. Application Data

(63) Continuation of application No. 12/608,372, filed on Oct. 29, 2009.

(30) Foreign Application Priority Data

Oct. 30, 2008  (KR) .......................... 10-2008-0107294
Mar. 18, 2009  (KR) .......................... 10-2009-0023042
Oct. 19, 2009  (KR) .......................... 10-2009-0099318

(51) Int. Cl.
*G09G 1/00*      (2006.01)
*G06F 3/044*     (2006.01)
(Continued)

(52) U.S. Cl.
CPC ............ *G06F 3/044* (2013.01); *G06F 1/3215* (2013.01); *G06F 1/3237* (2013.01);
(Continued)

(58) Field of Classification Search
CPC .......... G06F 3/041; G06F 3/044; H03K 17/94
See application file for complete search history.

(56) References Cited

U.S. PATENT DOCUMENTS 5,239,152 A    8/1993  Caldwell et al.
5,396,443 A    3/1995  Mese et al.
(Continued)

FOREIGN PATENT DOCUMENTS

CN    1771430 A    5/2006
CN    1940842      4/2007
(Continued)

OTHER PUBLICATIONS

Japanese Office Action dated Jan. 7, 2014.
(Continued)

*Primary Examiner* — Michael Faragalla
(74) *Attorney, Agent, or Firm* — Volentine, Whitt & Francos, PLLC

(57) ABSTRACT

A touch controller includes a touch data generator that is connected to a plurality of sensing lines, the touch data generator sensing a change in capacitance of a sensing unit connected to each of the sensing lines and generating touch data by processing the sensing signal corresponding to the result of sensing; and a signal processor that controls a timing of generating the touch data by receiving at least one piece of timing information for driving a display panel from a timing controller, and then providing either the timing information or a signal generated from the timing information as a control signal to the touch data generator.

12 Claims, 31 Drawing Sheets

(51) Int. Cl.
*G06F 3/041* (2006.01)
*H01L 27/32* (2006.01)
*G06F 1/32* (2006.01)
G09G 3/20 (2006.01)
G02F 1/1333 (2006.01)

(52) U.S. Cl.
CPC .......... *G06F 1/3265* (2013.01); *G06F 3/0412* (2013.01); *G06F 3/0418* (2013.01); *H01L 27/323* (2013.01); G02F 1/13338 (2013.01); G09G 3/2007 (2013.01); G09G 3/2092 (2013.01); G09G 2310/08 (2013.01); G09G 2354/00 (2013.01)

(56) References Cited

U.S. PATENT DOCUMENTS

| | | | |
|---|---|---|---|
| 5,861,583 A * | 1/1999 | Schediwy | G06F 3/041 178/18.01 |
| 5,880,411 A | 3/1999 | Gillespie et al. | |
| 6,236,386 B1 | 5/2001 | Watanabe | |
| 6,239,788 B1 | 5/2001 | Nohno et al. | |
| 6,452,514 B1 | 9/2002 | Philipp | |
| 7,123,232 B1 | 10/2006 | Edwards | |
| 8,154,533 B2 | 4/2012 | Jung et al. | |
| 8,274,481 B2 | 9/2012 | Nishimura et al. | |
| 8,451,234 B2 | 5/2013 | Sato et al. | |
| 9,335,868 B2 * | 5/2016 | Hotelling | G06F 3/044 |
| 2004/0155871 A1 | 8/2004 | Perski et al. | |
| 2007/0200833 A1 * | 8/2007 | Park | G06F 1/3203 345/173 |
| 2007/0236435 A1 * | 10/2007 | Miyazaki | G09G 3/3688 345/87 |
| 2007/0257890 A1 * | 11/2007 | Hotelling | G06F 3/0418 345/173 |
| 2007/0262966 A1 | 11/2007 | Nishimura et al. | |
| 2007/0273560 A1 * | 11/2007 | Hua | G06F 3/0202 341/33 |
| 2008/0062139 A1 | 3/2008 | Hotelling et al. | |
| 2008/0158178 A1 * | 7/2008 | Hotelling | G06F 3/044 345/173 |
| 2008/0192019 A1 * | 8/2008 | Lee | G06F 1/3203 345/173 |
| 2009/0289919 A1 | 11/2009 | Jung | |

FOREIGN PATENT DOCUMENTS

| | | |
|---|---|---|
| CN | 2927175 | 7/2007 |
| CN | 101185055 A | 5/2008 |
| CN | 101211241 | 7/2008 |
| CN | 101227678 | 7/2008 |
| JP | 05335925 A | 12/1993 |
| JP | H06119090 A | 4/1994 |
| JP | 09128146 | 5/1997 |
| JP | 10-233670 | 9/1998 |
| JP | 10-301695 | 11/1998 |
| JP | 11184630 | 7/1999 |
| JP | 2001166882 A | 6/2001 |
| JP | 2001306255 A | 11/2001 |
| JP | 3552085 B | 8/2004 |
| JP | 2006-146895 | 6/2006 |
| JP | 2007072798 A | 3/2007 |
| JP | 2008090623 A | 4/2008 |
| JP | 2008091116 A | 4/2008 |
| JP | 2008198063 A | 8/2008 |
| JP | 2009015489 A | 1/2009 |
| JP | 2009110418 A | 5/2009 |
| KR | 1020020056411 A | 7/2002 |
| KR | 1020070016683 A | 2/2007 |
| KR | 1020070067472 A | 6/2007 |
| KR | 1020070109360 A | 11/2007 |
| KR | 1020080013262 A | 2/2008 |
| KR | 20090121040 A | 5/2008 |
| KR | 1020010106494 A | 11/2011 |
| TW | 507183 B | 10/2002 |

OTHER PUBLICATIONS

Taiwanese Office Action dated March 29, 2015 Corresponding to Taiwanese Application No. TW98137023.
Chinese Office Action dated Apr. 25, 2013.
Korean Office Action dated Jun. 1, 2015 Corresponding to Korean Application No. KR10-2009-0099318.
Korean Office Action dated Jul. 31, 2014 Corresponding to Korean Application No. KR10-2008-0107294.
Japanese Office Action dated Sep. 16, 2014 Corresponding to Japanese Application No. JP2009-249334.
Taiwanese Office Action dated Nov. 21, 2014 Corresponding to Taiwanese Application No. TW98137023.
German Office Action dated Feb. 24, 2016 Related to German Application No. 10 2009 046 177.9.
Wikipedia, "Integrated circuit."
Japanese Office Action dated Jan. 4, 2016 in Corresponding Application No. JP 2015-5691.
Korean Action in Related Korean Application No. KR10-2008-0107294 dated Sep. 22, 2015.
Korean Office Action dated Mar. 31, 2015 Corresponding to Korean Application No. 09-23042.
Hyoung-Rae Kim et al., "A Mobile-Display-Driver IC Embedding a Capacitive-Touch-Screen Controller System," Samsung Best Paper Award 2009.
Japanese Decision of Rejection Corresponding to Japanese Application No. JP 2015-005691, dated Feb. 20, 2017.
Chinese Office Action Corresponding to Chinese Application No. CN 201410520350.0 dated Jul. 31, 2017.
Japanese Office Action Issued in Related JP Application No. JP 2017-109851 dated Mar. 5, 2018.

\* cited by examiner (a)

(b)

| TSC | Display | Power Generator | Timing information |
|---|---|---|---|
| Sleep | Sleep | Sleep | Off |
| Sleep | Normal | Normal | Off |
| Normal | Sleep | Sleep | On |
| Normal | Normal | Normal | On |

| Window glass |
| Air gap or resin |
| ITO (sensor) |
| Glass |
| Polarizer |
| Top Glass |
| ITO (cathode) |
| OLED |
| Metal (anode) |
| Bottom Glass |

DDI + TSC

TOUCH CONTROLLER HAVING INCREASED SENSING SENSITIVITY, AND DISPLAY DRIVING CIRCUIT AND DISPLAY DEVICE AND SYSTEM HAVING THE TOUCH CONTROLLER

PRIORITY CLAIM

This application is a Continuation of application Ser. No. 12/608,372, filed Oct. 29, 2009, of which priority under 35 U.S.C. § 119 is made to Korean Patent Application No. 10-2008-0107294 filed on Oct. 30, 2008, Korean Patent Application No. 10-2009-0023042, filed on Mar. 18, 2009, and Korean Patent Application No. 10-2009-0099318, filed on Oct. 19, 2009, the entirety of which are hereby incorporated by reference.

BACKGROUND

The inventive concepts relate to a touch controller, and more particularly, to a touch controller having increased sensing sensitivity, and a display driving circuit and a display device and system including the touch controller.

As a consequence of the need for thinner and lighter display devices, flat display devices have replaced cathode ray tubes (CRTs). Examples of flat display devices are LCDs, field emission displays (FEDs), organic light emitting diodes (OLEDs), and plasma display panels (PDPs).

In general, such flat display devices include a plurality of pixels that are arranged in a matrix in order to display an image. In an LCD which is an example of flat display device, a plurality of scan lines that deliver a gate selection signal and a plurality of data lines that deliver gratin data are arranged to intersect one another, whereby a plurality of pixels are formed where the scan lines and the data lines intersect one another.

A touch screen panel, e.g., a capacitive touch screen panel, includes a plurality of sensing units. If a user touches a screen of the touch screen panel with his/her finger or a touch pen, a capacitance value of a corresponding sensing unit changes. In general, the touch screen panel is attached to an upper part of a flat display device, and when a user's finger or a touch pen approaches or touches the sensing units of the touch screen panel, the capacitance value of a corresponding sensing unit is provided to a touch screen processor. The touch screen processor senses a capacitance of the corresponding sensing unit by using the sensing lines, and determines whether the touch screen panel is touched with a user's finger or a touch pen or determines the touched location on the touch screen panel. The sensing units may be included in a display panel in order to minimize a reduction in yield and brightness and an increase in the thickness of the display panel, caused when the touch screen panel is attached to the display panel.

FIG. 1 is a block diagram of a general touch screen system 10. Referring to FIG. 1, the touch screen system includes a touch screen panel 11 having a plurality of sensing units and a signal processor 12 that senses and processes a change in a capacitance of each of the sensing units and then generates touch data.

The touch screen panel 11 includes a plurality of sensing units disposed in a row and a plurality of sensing units disposed in a column. Referring to FIG. 1, the touch screen panel 11 includes a plurality of rows in which a plurality of sensing units are disposed, in which a plurality of sensing units are arranged in each of the rows. The plurality of sensing units arranged in each of the rows are electrically connected to one another. Also, the touch screen panel 11 includes a plurality of columns in which a plurality of sensing units are disposed, in which a plurality of sensing units are arranged in each of the columns. The plurality of sensing units arranged in each of the columns are electrically connected to one another.

The signal processor 12 generates the touch data by sensing a change in the capacitance of each of the plurality of sensing units of the touch screen panel 11. For example, signal processor 12 may sense a change in the capacitance of each of the plurality of sensing units in the plurality of rows and in the plurality of columns in order to determine whether the touch screen panel 11 is touched with a user's finger or a touch pen, or to determine the touched location on the touch screen panel 11.

However, the plurality of sensing units of the touch screen panel 11 contain a parasitic capacitance component. Such a parasitic capacitance component may be classified into a horizontal parasitic capacitance component generated between a plurality of sensing units and a vertical parasitic capacitance component generated between a sensing unit and a display panel. If the whole parasitic capacitance has a large value, a change in the capacitance of a sensing unit touched by a user's finger or a touch pen has a relatively small value, compared to the value of the whole parasitic capacitance. The closer the user's finger or the touch pen approaches the sensing unit, the greater the capacitance value of the sensing unit. However, when the sensing unit has a large parasitic capacitance value, the sensing sensitivity of the sensing unit is lowered. Also, a change in an electrode voltage VCOM applied onto the display panel may cause a sensing noise to occur during the touching of the sensing unit through the vertical parasitic capacitance component.

In addition, the performance of the touch screen system 11 may be affected by various noise factors which are generated in an undesirable environment. Examples of the various noise factors are an electromagnetic noise in the air, a skin accumulated noise, and a noise generated in the touch screen system 10. Such noises may degrade the sensing sensitivity of the touch screen system 10.

SUMMARY

The inventive concept provides a touch controller in which a sensing unit is affected less by a parasitic capacitance component and a noise, and a display driving circuit and a display device and system including the touch controller.

According to an aspect of the inventive concept, there is provided a touch controller that includes a touch data generator connected to a plurality of sensing lines, the touch data generator sensing a change in capacitance of a sensing unit connected to each of the sensing lines and generating touch data by processing a sensing signal indicative of a sensed change in the capacitance, responsive to a control signal; and a signal processor controlling a timing of generating the touch data responsive to at least one piece of timing information for driving a display panel as provided from a timing controller, the signal processor providing either the timing information or a signal generated from the timing information as the control signal to the touch data generator.

According to another aspect of the inventive concept, there is provided a display driving circuit including a display panel driving circuit unit including a timing controller generating at least one piece of timing information for driving a display panel; and a touch controller disposed to sense whether a touch screen panel is touched, the touch controller generating a sensing signal by sensing a change in capacitance of a sensing unit on the touch screen panel and processing the sensing signal, the touch controller including a touch data generator generating the sensing signal by sensing the change in the capacitance of the sensing unit via a sensing line, and generating touch data by processing the sensing signal, responsive to a control signal, and a signal processor controlling a timing of generating the touch data responsive to the timing information from the timing controller and supplying either the timing information or a signal generated from the timing information as the control signal to the touch data generator.

According to another aspect of the inventive concept, there is provided a display panel including a display panel displaying an image corresponding to received image data; a touch screen panel having a plurality of sensing units, a capacitance value of each of the sensing units varies according to a touching operation; a display panel driving circuit unit connected to the display panel to drive the display panel, the display panel driving circuit unit including a timing controller for generating timing information related to a displaying operation; and a touch controller connected to the touch screen panel to sense whether the touch screen panel is touched, the touch controller generating touch data based on the result of the sensing and controlling a timing of generating the touch data according to the timing information.

According to another aspect of the inventive concept, there is provided a touch controller including a voltage reading circuit reading first voltages from a plurality of sensing units connected to a plurality of sensing lines, respectively; a first amplification circuit offsetting influences in the read first voltages caused by a capacitance component generated in each of the plurality of sensing units, amplifying the resultant first voltages, and then outputting second voltages, and an integration circuit integrating the second voltages.

According to another aspect of the inventive concept, there is provided a display device including a panel unit including a plurality of sensing units performing a touch screen operation; a display driving circuit unit receiving at least one piece of first timing information from an external host, and generating image data to display an image on the panel unit; and a touch controller connected to the plurality of sensing units to sense a change in capacitances of the plurality of sensing units, the touch controller generating touch data from at least one selected from the at least one piece of first timing information and a plurality of pieces of timing information generated by the display driving circuit unit.

According to another aspect of the inventive concept, there is provided a display system including a host controller; a panel unit including a plurality of sensing units performing a touch screen operation; a display driving unit receiving at least one piece of first timing information from the host controller, and generating image data to display an image on the panel unit; and a touch controller connected to the plurality of sensing units to sense a change in capacitances of the plurality of sensing units, the touch controller generating touch data based on at least one of the first timing information and timing information generated by the display driving circuit unit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
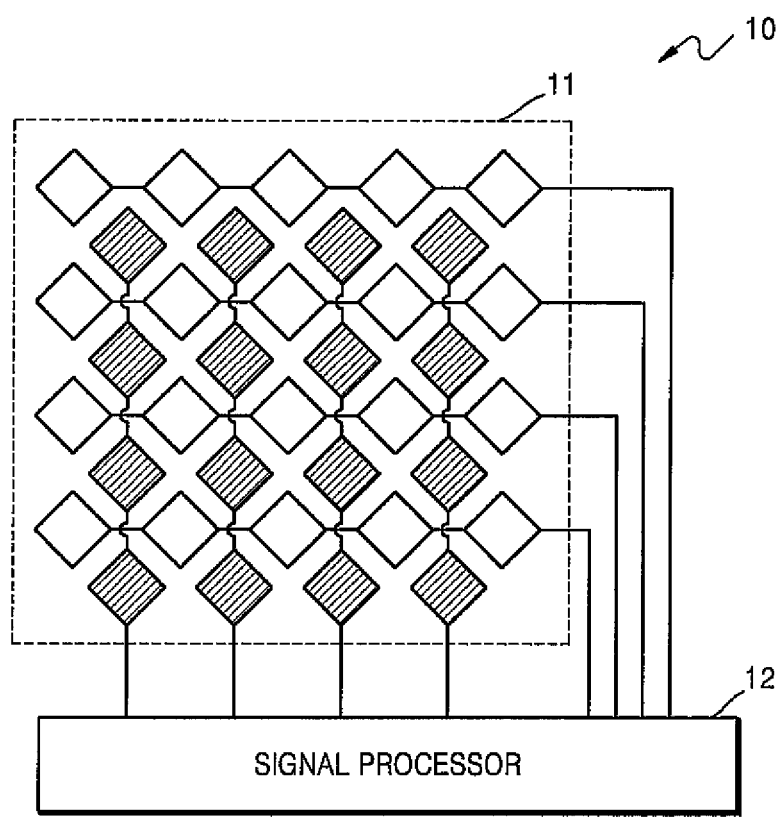
FIG. 1 is a block diagram of a general touch screen panel system.

Hereinafter, exemplary embodiments of the inventive concept will be described in detail with reference to the accompanying drawings. Like reference numerals denote like elements throughout the drawings.

Figure 2A:
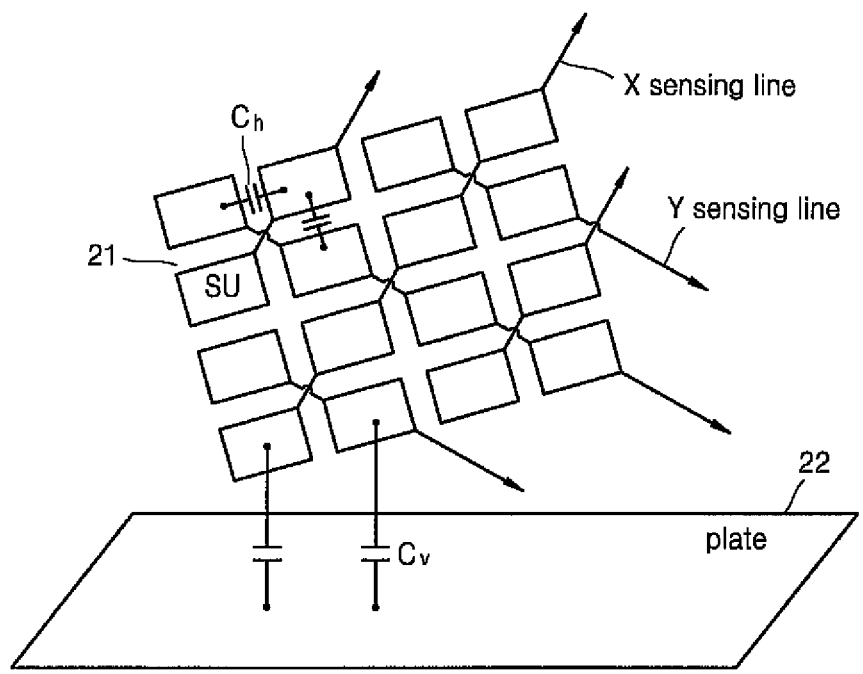
FIG. 2A illustrates a parasitic capacitance component generated in each of a plurality of sensing units of a touch screen panel according to an embodiment of the inventive concept.
Figure 2B:
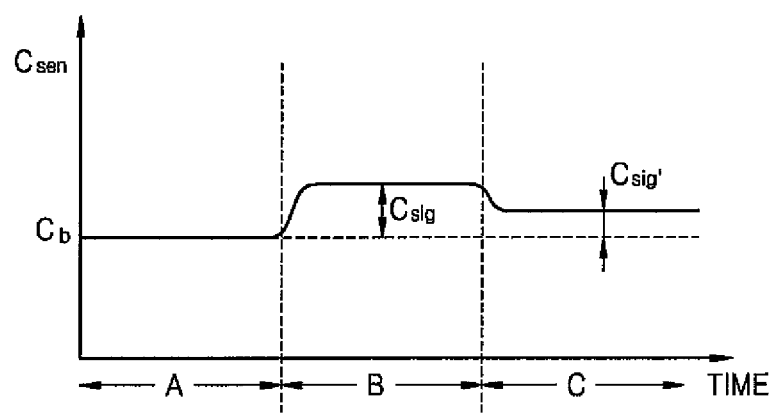
FIG. 2B is a graph showing a change in the capacitance of a sensing unit illustrated in FIG. 2A when the sensing unit is touched.
Figure 2C:
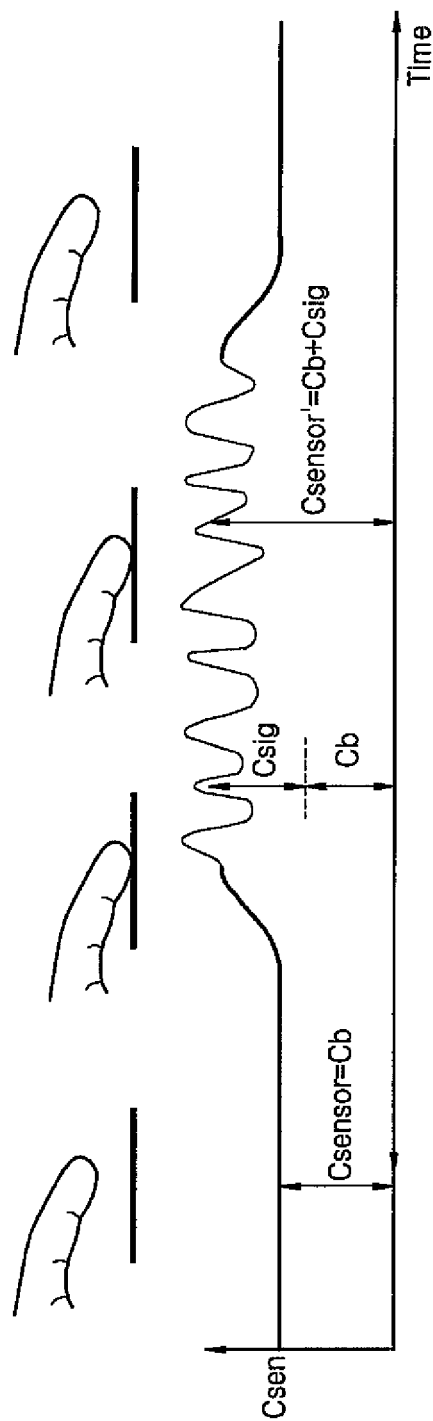
FIG. 2C is a graph showing a change in the capacitance of a sensing unit illustrated in FIG. 2A when a sensing unit is touched and a noise is generated.

FIG. 2A illustrates a parasitic capacitance component generated in each of a plurality of sensing units SU of a touch screen panel 21 according to an embodiment of the inventive concept. FIG. 2B is a graph showing a change in the capacitance of a sensing unit SU illustrated in FIG. 2A when the sensing unit is touched. FIG. 2C is a graph showing a change in the capacitance of a sensing unit SU illustrated in FIG. 2A when the sensing unit is touched and a noise is generated.

Referring to FIG. 2A, the touch screen panel 21 includes the plurality of sensing units SU. The plurality of sensing units SU may be arranged near or on a display panel 22 that displays an image. For example, the reference numeral '22' may denote an upper plate of a display panel to which a predetermined electrode voltage VCOM is applied. The display panel having the upper plate 22 may be a liquid crystal display (LCD) panel, to which the electrode voltage VCOM may be applied as a common electrode voltage. If the display panel is an organic light-emitting display panel, a cathode electrode having a direct-current (DC) voltage may be applied to an upper plate thereof.

The touch screen panel 21 includes a plurality of sensing units SU connected to a plurality of sensing lines arranged in a row (in an x-axis direction) and a plurality of sensing units SU connected to a plurality of sensing lines arranged in a column (in an y-axis direction). If a user's finger or a touch pen approaches or touches any of the sensing units SU, a capacitance value of the particular sensing unit SU is changed. Whether the touch screen panel 21 is touched, and the touched location on the touch screen panel 21, may be determined by generating a sensing signal by sensing a change in the capacitance value of each of the sensing units by using the plurality of sensing lines and then processing the sensing signal.

Parasitic capacitance components are present due to an arrangement of the plurality of sensing units SU. For example, the parasitic capacitance components include a horizontal parasitic capacitance component Ch generated between adjacent sensing units and a vertical parasitic capacitance component Cv generated between a sensing unit and the display panel 22. If a parasitic capacitance value is greater than the value of a capacitance component generated when a user's finger or a touch pen approaches or touches a sensing unit, even when the capacitance value of the sensing unit is changed by touching the sensing unit, the sensing sensitivity of the touching is lowered.

Referring to FIG. 2B, the sensing unit SU contains a basic capacitance component Cb including a parasitic capacitance component, and a capacitance value of the sensing unit SU is changed when an object, e.g., a user's finger or a touch pen, approaches or touches the sensing unit SU. For example, when a conductive object approaches or touches the sensing unit SU, the capacitance value of the sensing unit SU increases. Referring to FIG. 2B, in a section A, the capacitance value of the sensing unit SU is Cb since the conductive object does not approach the sensing unit SU; in a section B, the conductive object touches the sensing unit SU; and in a section C, the conductive object approaches the sensing unit SU. Referring to FIG. 2B, the capacitance value of Cb may increase by a degree Csig when the conductive object touches the sensing unit SU and may increase by a degree Csig' that is less than the degree Csig when the conductive object approaches the sensing unit SU.

As illustrated in FIG. 2C, the capacitance value of the sensing unit SU may be affected greatly when various noises are present. In this case, a processor or controller (not shown) cannot determine precisely whether an object touches the sensing unit SU and the touched location on the sensing unit SU by simply checking whether the capacitance value of the sensing unit SU increases or decreases, thereby greatly degrading the sensing sensitivity of a touch screen device.

Figure 3A:
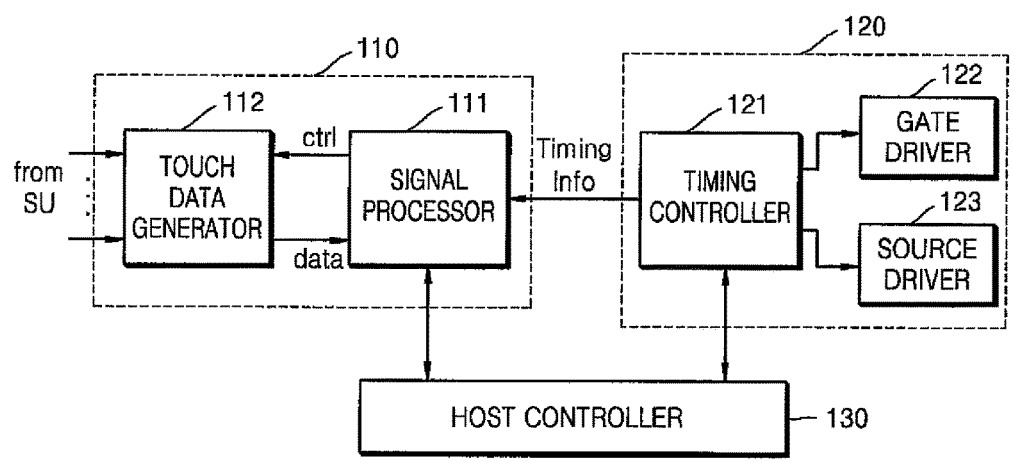
FIGS. 3A, 3B, and 3C are block diagrams of a touch controller according to embodiments of the inventive concept.
Figure 3B:
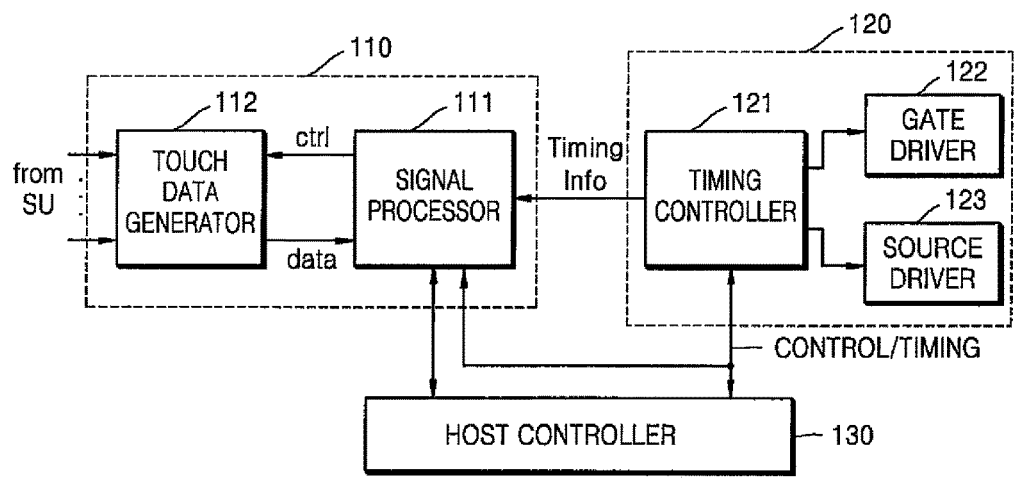
Figure 3C:
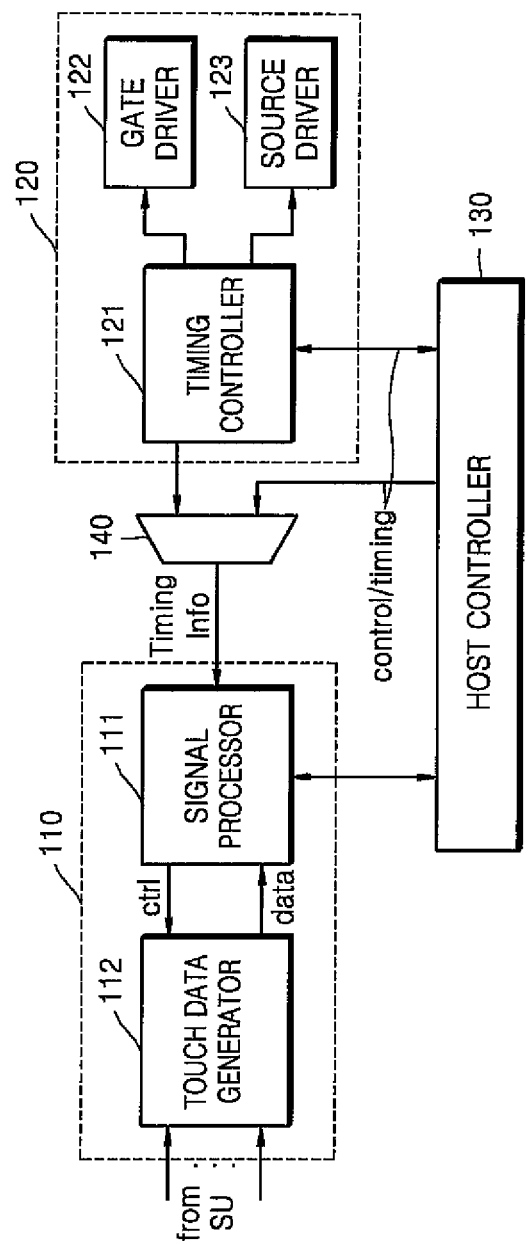

FIGS. 3A, 3B, and 3C are block diagrams of a touch controller 110 according to embodiments of the inventive concept. Here, a display driving circuit 120 that drives a display panel (not shown) to display an image and a host controller 130 that controls the overall operations of the touch controller 110, are further illustrated in order to help explain the operation of the touch controller 110.

Referring to FIG. 3A, the touch controller 110 may include a signal processor 111 and a touch data generator 112. The display driving circuit 120 may include a timing controller 121 that controls an image to be displayed on the display panel, a gate driver 122, and a source driver 123.

The signal processor 111 controls the overall operations of internal circuits of the touch controller 110 in relation to a touch screen operation. Although not shown, the touch data generator 112 is electrically connected to a plurality of sensing units SU via sensing lines and generates a sensing signal by sensing a change in the capacitance of each of the plurality of sensing units SU when they are touched. Also, the touch data generator 112 generates and outputs touch data data by processing the sensing signal. The signal processor 111 or the host controller 130 performs a logic operation based on the touch data data, and determines whether a touch screen (not shown) is touched and the touched location on the touch screen.

The touch controller 110 receives at least one piece of timing information Timing info for driving a display panel (not shown), and may use the timing information Timing info in order to generate the touch data data. The timing information Timing info may be generated by either the timing controller 121 included in the display driving circuit 120 or directly by the host controller 130. FIG. 3A illustrates that the timing information Timing info is generated by the timing controller 121 and the touch controller 110 receives the timing information Timing info from the timing controller 121. The signal processor 111 receives the at least one piece of timing information Timing info and transmits a control signal ctrl based on the at least one piece of timing information Timing info to the touch data generator 112.

The control signal ctrl may be generated based on a wave form of the timing information Timing info. The control signal ctrl may be generated directly by the timing controller 121 and provided to the signal processor 111, or the signal processor 111 may generate the control signal ctrl from the timing information Timing info received from the timing controller 121. Also, as described above, the host controller 130 may generate the timing information Timing info, and similarly, the control signal ctrl may be generated by the host controller 130 and provided to the touch controller 110. If the host controller 130 generates the control signal ctrl, the control signal ctrl may be supplied to the signal processor 111 or may be supplied directly to the touch data generator 112. Hereinafter, it is assumed that the signal processor 111 generates the control signal ctrl as illustrated in FIGS. 3A to 3C.

The timing controller 121 generates at least one signal for controlling a timing of displaying an image. For example, the timing controller 121 may receive a vertical synchronization signal Vsync and a horizontal synchronization signal Hsync directly from the external host controller 130, or may generate the vertical synchronization signal Vsync and the horizontal synchronization signal Hsync based on a data enable signal (not shown) received from the host controller 130. Also, the timing controller 121 may control generation of a common electrode voltage, e.g., an electrode voltage VCOM, and generation of a gate line signal by generating at least one timing signal.

The signal processor 111 generates the control signal ctrl in synchronization with the at least one piece of timing information Timing info received from the timing controller 121, and supplies the control signal ctrl to the touch data generator 112 in order to control a timing of generating the touch data data. That is, if a voltage applied to the display panel, e.g., a common electrode voltage applied to an upper plate of the display panel, changes, then a noise may be contained in a sensing signal. Accordingly, the signal processor 111 controls the touch data data to be generated during a period when the voltage is in a stable state.

The touch controller 110 and the display driving circuit 120 may be integrated in one semiconductor chip. That is, in an embodiment of the inventive concept, the touch controller 110 receives at least one piece of timing information Timing info from the display driving circuit 120 and performs an operation in synchronization with the timing information Timing info, the timing information Timing info may be transmitted via a wire interconnecting the touch controller 110 and the display driving circuit 120 in one semiconductor chip.

FIGS. 3B and 3C are block diagrams illustrating various ways of generating the touch data data illustrated in FIG. 3A according to embodiments of the inventive concept. FIG. 3B illustrates a case where the touch controller 110 receives information control/timing related to a timing of driving a display panel (not shown) directly from the host controller 130. In this case, the timing controller 121 may skip generating timing information Timing info based on the information control/timing received from the host controller 130 and supplying it to the touch controller 110. The signal processor 111 receives the information control/timing from the host controller 130, generates a control signal ctrl based on the information control/timing, and supplies the control signal ctrl to the touch data generator 112.

FIG. 3C illustrates a case where information generated by a timing controller 121 and information generated by the host controller 130 are multiplexed into timing information Timing info and the timing information Timing info is supplied to the touch controller 110. To this end, a selection unit 140 that allows a signal to be selectively supplied may be disposed between the touch controller 110 and the display driving circuit 120 illustrated in FIG. 3C. For example, the selection unit 140 may be embodied as a multiplexer (MUX). The selection unit 140 may be disposed between the touch controller 110 and the display driving circuit 120 or may be disposed before a signal processor 111 included in the touch controller 110. The selection unit 140 selectively outputs the information generated by the timing controller 121 or the information generated by the host controller 130, in response to a predetermined control signal (not shown). In this case, if the display driving circuit 120 operates in a normal mode, the information generated by the timing controller 121 may be supplied to the touch controller 110. If the display driving circuit 120 enters a power down mode, e.g., a sleep mode, the information generated by the host controller 130 may be supplied to the touch controller 110.

Figure 4A:
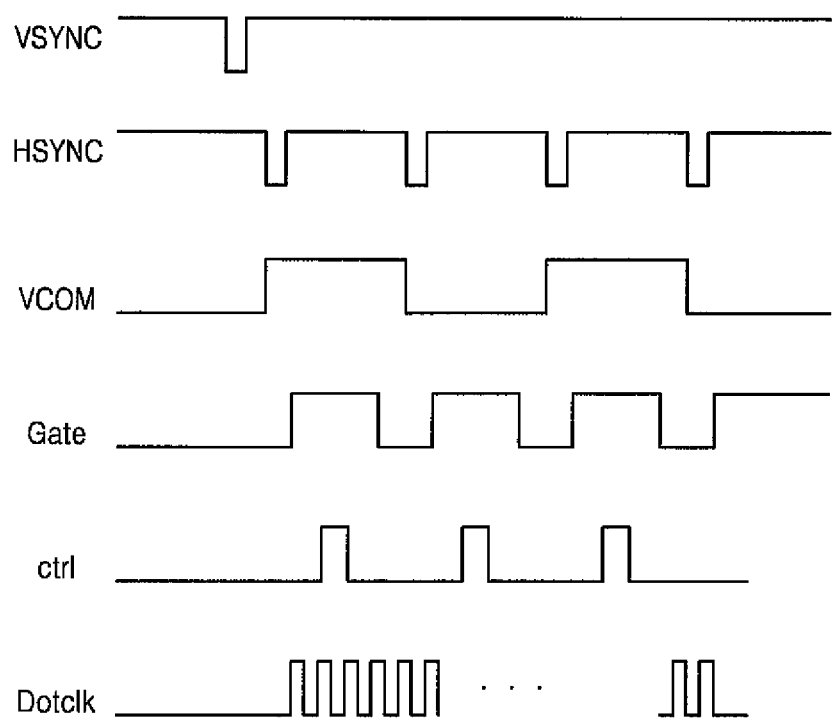
FIGS. 4A and 4B are waveform diagrams of various signals for generating the control signal ctrl illustrated in FIGS. 3A to 3C, according to embodiments of the inventive concept.

FIG. 4A is a waveform diagram of various signals for generating the control signal ctrl illustrated in FIGS. 3A to 3C, according to an embodiment of the inventive concept. Referring to FIG. 4A, a horizontal synchronization signal Hsync is activated after a vertical synchronization signal Vsync is activated. A logic level of a common electrode voltage, e.g., an electrode voltage VCOM, changes in synchronization with the horizontal synchronization signal Hsync. The control signal ctrl may be generated from at least one of various types of timing information, e.g., the vertical or horizontal synchronization signal Hsync or Vsync, timing information for generating a common electrode voltage, DotCLK information). A timing of generating touch data data is controlled according to a timing of activating the control signal ctrl, and a noise may be prevented from being generated in the touch data data, caused by a change in an electrode applied to a display panel.

Figure 4B:
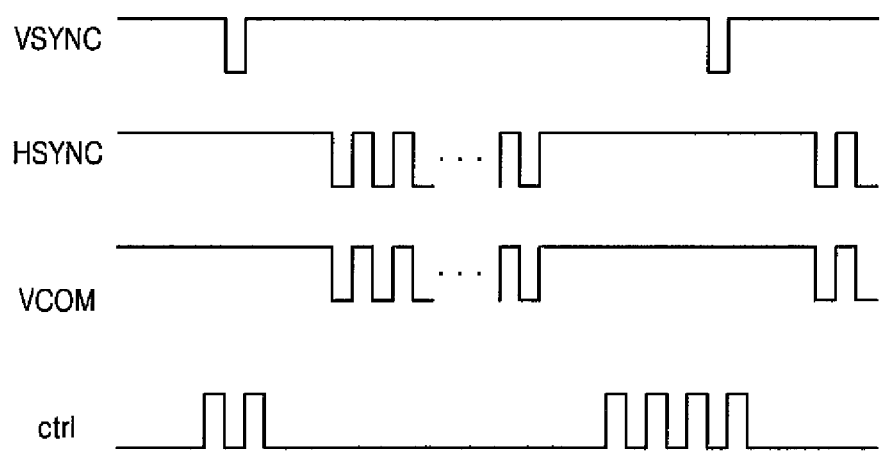

FIG. 4B is a waveform diagram of various signals for generating the control signal ctrl illustrated in FIGS. 3A to 3C, according to another embodiment of the inventive concept. Referring to FIG. 4B, a porch section in which a horizontal synchronization signal Hsync is not activated, is present before and after a section in which a vertical synchronization signal Vsync is activated. A common electrode voltage applied to a display panel is controlled not to change during the porch section. In this case, it is possible to reduce a noise generated due to a change in a voltage applied to a display panel by activating the control signal ctrl in the porch section of the vertical synchronization signal Vsync.

FIGS. 5A to 8D are circuit diagrams and graphs illustrating various embodiments of a touch data generator according to the inventive concept. In detail, FIGS. 5A to 8D illustrate methods of reducing influences caused by a vertical or horizontal parasitic capacitance components present in a sensing unit by using an amplification circuit, according to embodiments of the inventive concept.

Figure 5A:
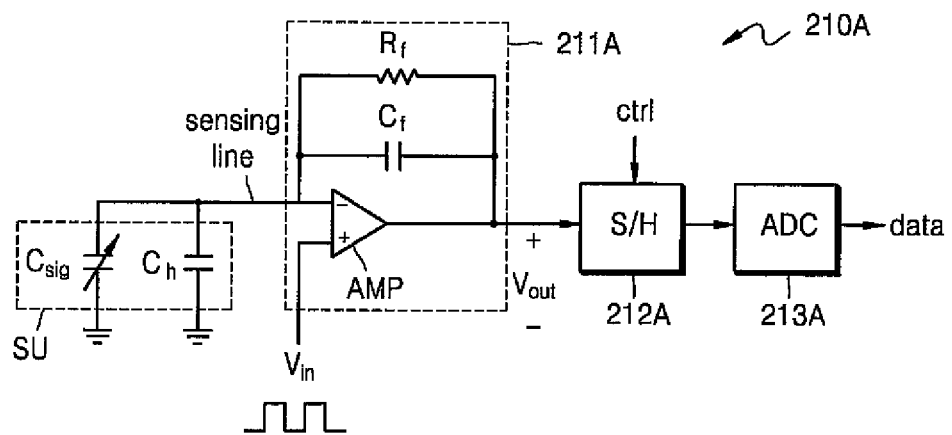
FIGS. 5A, 5B, 6A, 6B, 7A, 7B and 8A-8D are circuit diagrams and graphs illustrating various embodiments of a touch data generator according to the inventive concept.

Specifically, FIG. 5A is a circuit diagram of a touch data generator 210A, such as the touch data generator 112 of FIG.

Figure 5B:
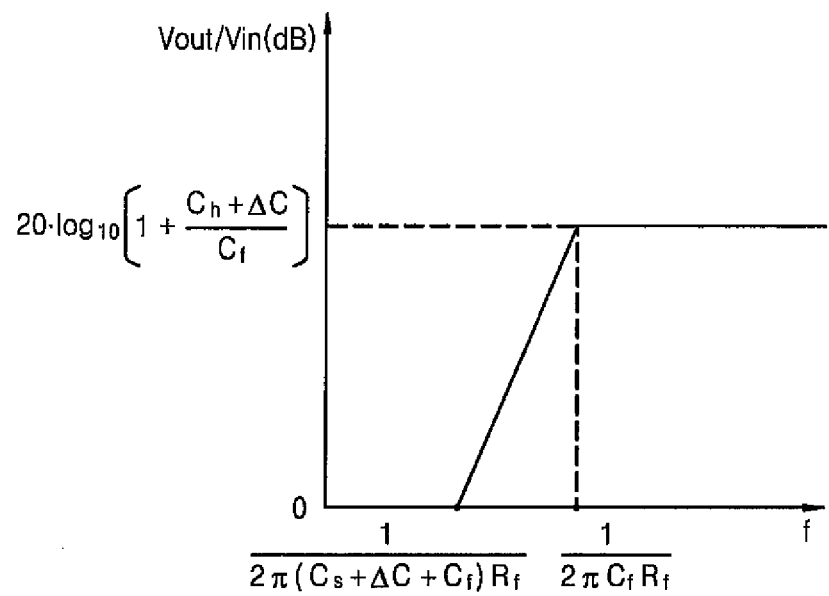

3A, according to an embodiment of the inventive concept. FIG. 5B is a graph showing frequency characteristics of an amplifier AMP included in the touch data generator 210A of FIG. 5A according to an embodiment of the inventive concept. Referring to FIG. 5A, the touch data generator 210A includes an amplification circuit 211A that is connected to a sensing unit SU and generates a sensing signal Vout corresponding to a change in the capacitance of the sensing unit SU. The touch data generator 210A may further include a signal output unit 212A that receives the sensing signal Vout and outputs the sensing signal Vout in response to a control signal ctrl, and an analog-to-digital converter (ADC) 213A that receives an analog signal from the signal output unit 212A and converts the analog signal into a digital signal. The signal output unit 212A may be a sample/hold circuit that retains the sensing signal Vout and outputs the sensing signal Vout in response to the control signal ctrl.

The amplification circuit 211A includes at least one amplifier AMP. Although not shown, the at least one amplifier AMP may include a plurality of amplifiers respectively connected to a plurality of sensing lines arranged in a plurality of rows and columns in a touch screen panel. Otherwise, the amplifier AMP may be constructed such that the amplifier AMP is switched to be connected with one of the plurality of sensing lines, so that the amplifier AMP may be shared by the plurality of sensing lines. For convenience of explanation, FIG. 5A illustrates a case where one amplifier AMP is connected to one sensing line.

A first input terminal, e.g., an inversion input terminal (−) of the amplifier AMP is connected to the sensing unit SU in order to sense a change in the capacitance of the sensing unit SU. As illustrated in FIG. 5A, the capacitance of the sensing unit SU may include a parasitic capacitance component, e.g., a horizontal parasitic capacitance component Ch, and a capacitance variation Csig caused when the sensing unit SU is touched.

An input signal Vin having a predetermined frequency is supplied to a second input terminal of the amplifier AMP. The input signal Vin may be a signal, e.g., a square-wave or sinusoidal-wave signal having a predetermined pulse cycle. The logic level and frequency of the input signal Vin may be adjusted appropriately. The frequency of the input signal Vin may fall within a pass band of the amplifier AMP having high-pass filtering characteristics. Although not shown, a direct-current (DC) voltage (e.g., ground voltage) signal may be supplied to second input terminals of amplifiers connected to the sensing lines other than the sensing line that performs a sensing operation. Thus, referring to FIG. 5A, one node of the horizontal parasitic capacitance component Ch is represented as being applied to a ground voltage.

A capacitor Cf may be connected between the first input terminal and an output terminal of the amplifier AMP, and a predetermined resistor Rf may further connected between the first input terminal and the output terminal of the amplifier AMP to be parallel to the capacitor Cf. Accordingly, the amplifier AMP may act as a high-pass filter having a predetermined voltage gain.

The amplifier AMP generates the sensing signal Vout, the voltage level of which varies according to a change in the capacitance of the sensing unit SU. FIG. 5B illustrates the pass-band characteristics and voltage gain of the amplifier AMP. As illustrated in FIG. 5A, the frequency of the input signal Vin may be greater than $$\frac{1}{2\pi C_f R_f}.$$

If the frequency of the input signal Vin falls within the pass band of the amplifier AMP, the gain of the amplifier AMP is calculated by a numerical formula, $$20\log_{10}\left(1 + \frac{C_h + \Delta C}{C_f}\right).$$

When as expressed in the above equation, the capacitance of the sensing unit SU changes when the sensing unit SU is touched, the logic level of the sensing signal Vout generated by the amplifier AMP is changed according to the change in the capacitance of the sensing unit SU. The amplifier AMP generates the sensing signal Vout corresponding to the capacitance value of the sensing unit SU in an analog manner. Whether the touch screen panel is touched, or the touched location on the touch screen panel, may be determined by sensing a change in the voltage of the sensing signal Vout.

The control signal ctrl may be generated using at least one piece of timing information and may be used in order to generate touch data data using the sensing signal Vout. The signal output unit 212A receives the sensing signal Vout from the amplification circuit 211A, retains the sensing signal Vout, and supplies the sensing signal Vout to the ADC 213A in response to the activated control signal ctrl. The ADC 213A generates the touch data data by converting the sensing signal Vout that is an analog signal into a digital signal, and supplies the converted result to the outside.

As described above, whether a touch screen is touched, and the touched location on the touch screen, may be determined by performing a sensing operation and generating the touch data data. Also, generation of a noise caused by a change in a voltage applied to a display panel may be minimized by controlling a timing of generating the touch data data in response to the control signal ctrl.

However, if the value of the parasitic capacitance component Ch between a plurality of sensing units SU is increased, then the gain of the amplifier AMP is also increased. In this case, the capacitor Cf connected between the first input terminal and the output terminal of the amplifier AMP should have a large value in order for the level of the voltage output from the amplifier AMP to be in a predetermined range (e.g., within the voltage range in which a system can operate). However, if the capacitance of the capacitor Cf has a large value, a change in the voltage of the amplifier AMP, i.e., a ratio Csig/Cf of the capacitance variation Csig to the value of the capacitor Cf, when the touch screen panel is touched becomes small, thereby lowering the sensing sensitivity of the touching. The sensing lines of the touch screen panel may be formed of a transparent conductive material, e.g., an indium-tin oxide (ITO). Thus, when the distances between sensing units SU are large, the sensing lines become conspicuous, and thus, the distances between the sensing units SU should be determined to be small. However, if the distances between the sensing units are small, the value of the horizontal parasitic capacitance component Ch generated in each of the sensing units becomes greater, and thus, sensing sensitivity of touching may be degraded. Various embodiments of a touch data generator capable of improving sensing sensitivity by reducing a parasitic capacitance component according to the inventive concept will now be described.

Figure 6A:
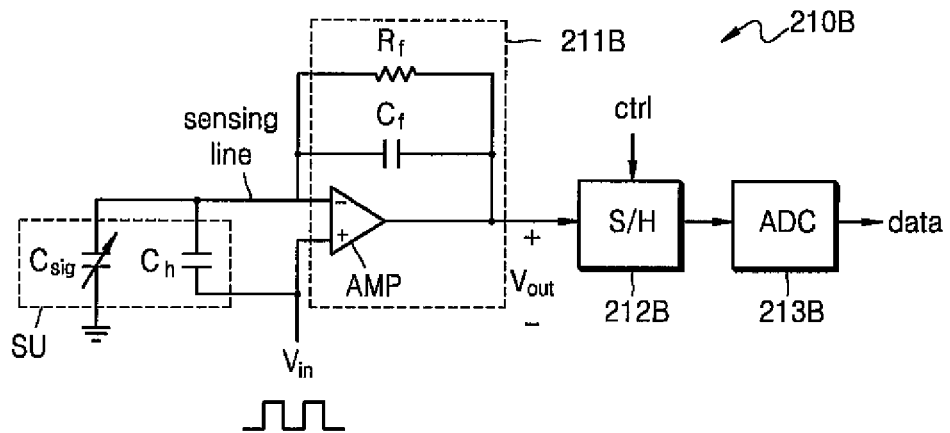

Referring to FIG. 6A, a touch data generator 210B includes an amplification circuit 211B that generates a sensing signal Vout corresponding to a change in the capacitance of a sensing unit SU. The touch data generator 210B may further include a signal output unit 212B that receives the sensing signal Vout and outputs it according to a control signal ctrl, and an ADC 213B that generates touch data data by converting the sensing signal Vout that is an analog signal received from the signal output unit 212B into a digital signal.

The amplification circuit 211B of FIG. 6A may increase sensing sensitivity by reducing influences caused by a horizontal capacitance component Ch generated in the sensing unit SU (a parasitic capacitance component between a plurality of sensing units SU). To this end, a ground voltage or a DC voltage is not applied to an amplifier AMP corresponding to a sensing line adjacent to a sensing line via which a sensing operation is performed, but rather an input signal Vin is applied to a second input terminal, e.g., a (+) terminal, of an amplifier Amp corresponding to a sensing line adjacent a sensing line via which a sensing operation is performed.

That is, if a first electrode and second electrode of a horizontal parasitic capacitor act as a first sensing line via which a sensing operation is performed and a second sensing line adjacent to the first sensing line, respectively, then the same voltage is applied to the first sensing line and the second sensing line. In this case, the horizontal parasitic capacitance component Ch is removed from the numerical formula, $$20\log_{10}\left(1 + \frac{C_h + \Delta C}{C_f}\right)$$

of calculating the gain of the amplifier AMP.

Although FIG. 6A illustrates the second electrode of the horizontal parasitic capacitor is connected directly to the corresponding second input terminal of the amplifier AMP, the inventive concept is not limited thereto. Unlike as illustrated in FIG. 5A, in the current embodiment of FIG. 6A, the input signal Vin is commonly supplied to second input terminals, i.e., (+) input terminals, of a plurality of amplifiers AMP. When the input signal Vin is supplied to the second input terminal, i.e., the (+) input terminal, of the amplifier AMP, a voltage of the first input terminal, i.e., a (−) input terminal, of the amplifier AMP becomes equal to the voltage of the second input terminal, i.e., the (+) input terminal. That is, since the input signal Vin is also supplied to the second input terminal of the amplifier AMP connected to the adjacent sensing line, a voltage of the adjacent sensing line also becomes equal to the value of the input signal Vin. For this reason, the voltage the first sensing line via which a sensing operation is performed is equal to the voltage of the second sensing line adjacent to the first sensing line, and thus, the gain of the amplifier AMP is not related to the value of the horizontal parasitic capacitance component Ch. That is, the same voltage Vin is applied to sensing lines adjacent to each other, in order to reduce the influences caused by a horizontal parasitic capacitance component in the sensing unit.

Figure 6B:
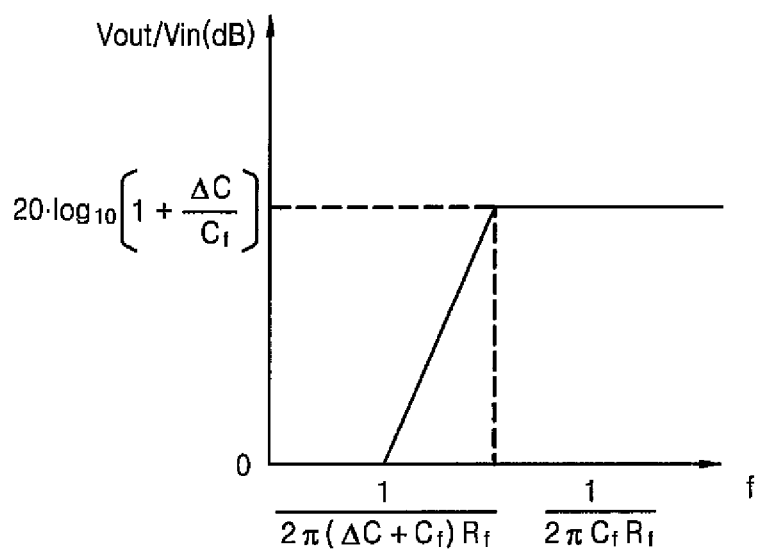

FIG. 6B is a graph showing the frequency characteristics of the amplifier AMP of FIG. 6A according to an embodiment of the inventive concept. As described above, the frequency of an input signal Vin is determined to fall within a pass band of the amplifier AMP. That is, the frequency of the input signal Vin may be determined to be greater than $$\frac{1}{2\pi C_f R_f}$$

illustrated in FIG. 6B. Also, the gain of the amplifier AMP of FIG. 6A is equal to $$20\log_{10}\left(1 + \frac{C_{sig}}{C_f}\right).$$

That is, the gain of the amplifier AMP is not related to the value of a horizontal parasitic capacitance component Ch connected to a corresponding sensing line.

Even if the value of a horizontal parasitic capacitance component Ch present in a sensing line of a touch screen panel increases, the gain of the amplifier AMP is not changed. Thus, the capacitance value of the capacitor Cf of FIG. 6A does not need to be increased so that the gain of the amplifier AMP falls within a predetermined range. Accordingly, it is possible to appropriately increase the ratio Csig/Cf that represents sensing sensitivity and to improve the sensing sensitivity of the capacitance variation Csig when touching is made.

Figure 7A:
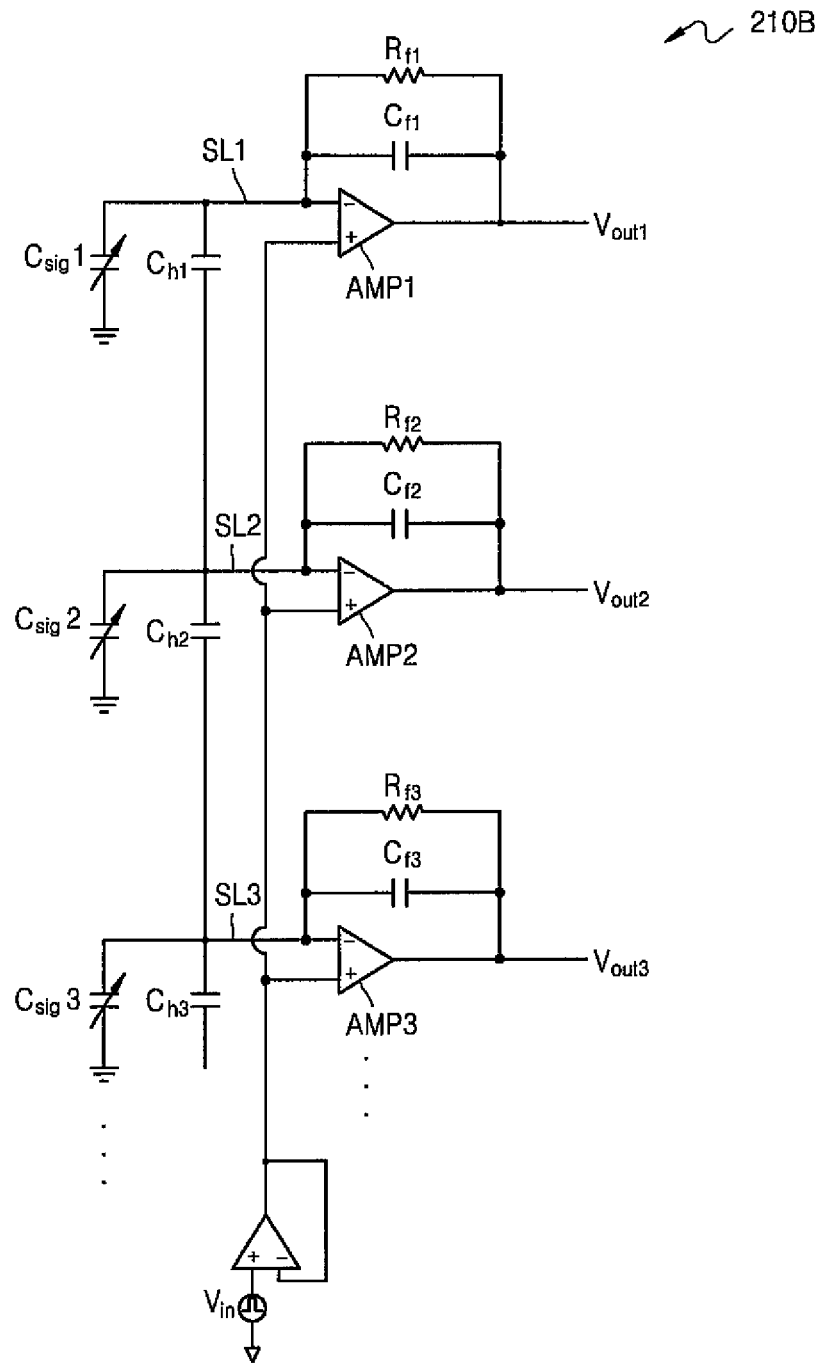
Figure 7B:
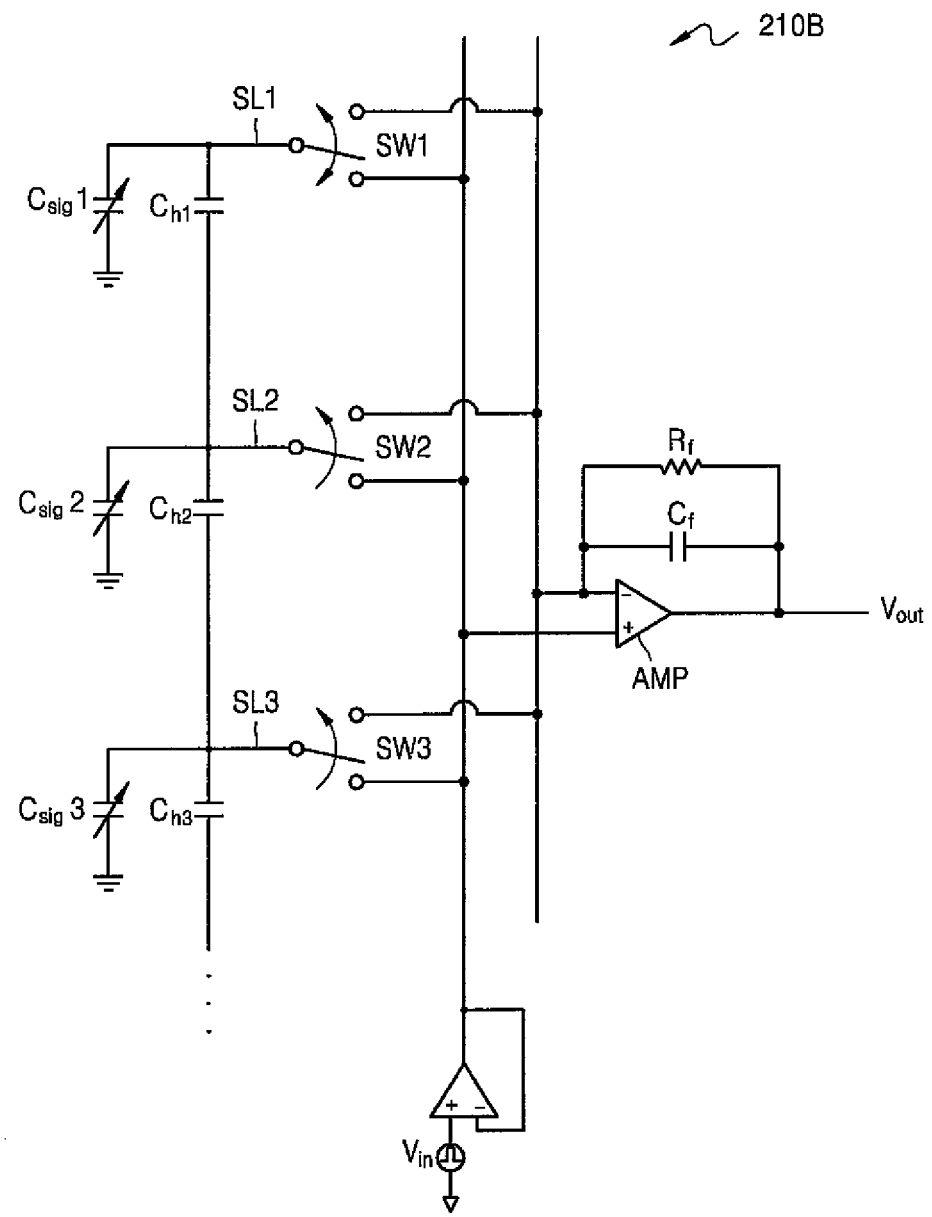

FIGS. 7A and 7B are circuit diagrams illustrating in detail the touch data generator 210B of FIG. 6A. For convenience of explanation, the signal output circuit 212B and the ADC 213B included in the touch data generator 210B are not illustrated here.

As illustrated in FIG. 7A, the touch data generator 210B may include a plurality of amplifiers, e.g., a first amplifier AMP1 to a third amplifier AMP3, which are connected to a plurality of sensing lines, e.g., a first sensing line SL1 to a third sensing line SL3, respectively. The first and third amplifiers AMP1 to AMP3 sense a change in the capacitances of sensing units (not shown) corresponding thereto and generate first to third sensing signals Vout1 to Vout3 corresponding to the sensed changes, respectively. First to third capacitors Cf1 to Cf3 and first to third resistors Rf1 to Rf3 may be connected in parallel between first input terminals, e.g., (−) input terminals, and output terminals of the respective first to third amplifiers AMP1 to AMP3.

Also, an input signal Vin having a predetermined frequency is commonly supplied to the second input terminal, e.g., the (+) input terminals) of the first to third amplifiers AMP1 to AMP3. The first to third amplifiers AMP1 to AMP3 correspond to and are connected to the first to third sensing lines SL1 to SL3, respectively. Thus, the first to third amplifiers AMP1 to AMP3 sense a change in the capacitances of the corresponding first to third sensing lines SL1 to SL3 and generate the first to third sensing signals Vout1 to Vout3, respectively. In FIG. 7A, horizontal parasitic capacitance components Ch1 to Ch3 are generated between the first to third sensing lines SL1 to SL3.

The operation of the touch data generator 210B will now be described assuming that a sensing operation is performed using the second sensing line SL2. The first input terminal, e.g., the (−) input terminal, of the second amplifier AMP2 is connected to the second sensing line SL2, and thus, the second amplifier AMP2 generates the second sensing signal Vout2 corresponding to the capacitance value of a corresponding sensing unit. The input signal Vin that is supplied to the second amplifier AMP2 is also supplied to the second input terminals, i.e., the (+) input terminals, of the first and third amplifiers AMP1 and AMP3. Voltages of the respective first input terminals, e.g., the (−) input terminals, of the first and third amplifiers AMP1 and AMP3 become equal to voltages of the respective second input terminals, e.g., the (+) input terminals, of the first and third amplifiers AMP1 and AMP3. Thus, voltages of the first and third sensing lines SL1 and SL3 being respectively connected to the first input terminals, e.g., the (−) input terminals, of the respective first and third amplifiers AMP1 and AMP3 become equal to a voltage of the second sensing line SL2. Thus, voltages of adjacent sensing lines become equal to or similar to each other. Accordingly, influences caused by the horizontal capacitance components Ch1 and Ch2 may be reduced as illustrated above in FIG. 6B.

FIG. 7B is a circuit diagram of a touch data generator 210B designed to perform the operation of the touch data generator of FIG. 7A, in which one amplifier AMP is shared by first to third sensing lines SL1 to SL3, according to another embodiment of the inventive concept. The touch data generator 210B of FIG. 7B may further include first to third switches SW1 to SW3 that switch connection of a first input terminal, e.g., an (−) input terminal, of the amplifier AMP between the first to third sensing lines SL1 to SL3, respectively, so that the first to third sensing lines SL1 to SL3 may be selectively connected to the first input terminal, e.g., the (−) input terminal, of the amplifier AMP.

When a sensing operation is performed using the second sensing line SL2, the second switch SW2 is switched on to connect the second sensing line SL2 to the first input terminal, e.g., the (−) input terminal, of the amplifier AMP. Also, the first switch SW1 connected to the first sensing line SL1 adjacent to the second sensing line SL2 is switched on to connect the first sensing line SL1 to a line that transmits an input signal Vin. The third switch SW3 connected to the third sensing line SL3 adjacent to the second sensing line SL2 is also switched on to connect the third sensing line SL3 to the line that transmits the input signal Vin.

Accordingly, the amplifier AMP senses a capacitance value of a corresponding sensing unit (not shown) via the second sensing line SL2 and generates a sensing signal Vout according to the sensed capacitance value. Since the input signal Vin is supplied to the first sensing line SL1 and the third sensing line SL3 adjacent to the second sensing line SL2, a voltage of the second sensing line SL2 becomes equal to those of the first and third sensing lines SL1 and SL3. Thus, influences caused by a horizontal parasitic capacitance component Ch2 are reduced, thereby improving sensing sensitivity of touching.

Figure 8A:
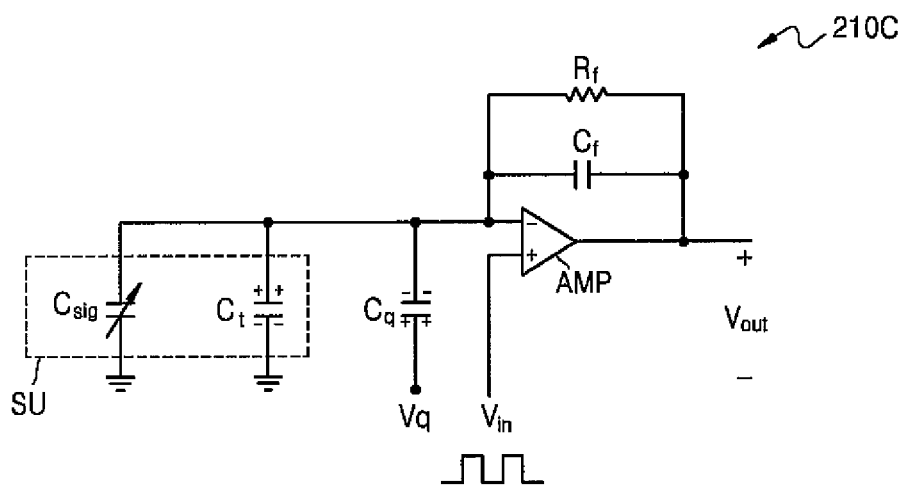
Figure 8B:
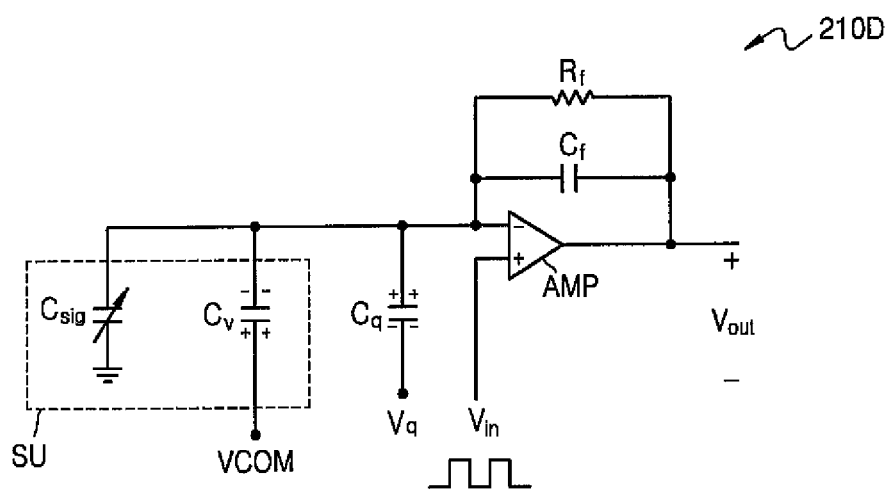
Figure 8C:
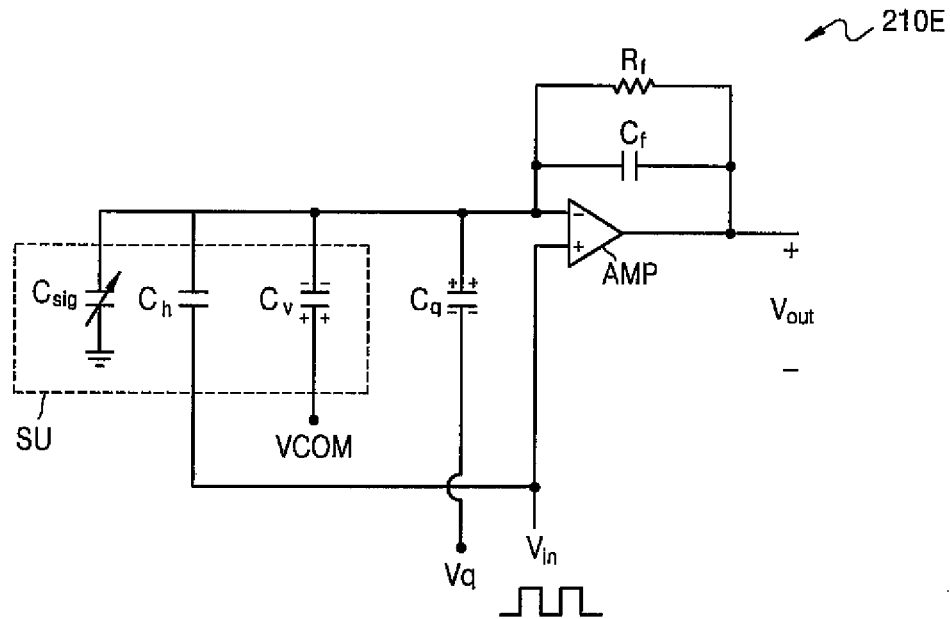

FIGS. 8A to 8C are circuit diagrams respectively illustrating touch data generators 210C, 210D, and 210E that are various embodiments of the touch data generator 112 of FIG. 3A, 3B or 3C, according to the inventive concept. Referring to FIGS. 8A to 8C, the touch data generators 210C, 210D, and 210E further include an additional capacitor, e.g., a second capacitor Cq, in order to compensate for a parasitic capacitance component present in a sensing unit SU. Accordingly, sensing sensitivity may be improved by removing a horizontal or vertical parasitic capacitance components present in the sensing unit SU.

Referring to FIG. 8A, the touch data generator 210C includes an amplifier AMP having a first input terminal, e.g., a (−) input terminal, which is connected to a sensing line and a second input terminal, e.g., a (+) input terminal to which an input signal Vin is supplied. A first capacitor Cf and a resistor Rf may be connected in parallel between the first input terminal and an output terminal of the amplifier AMP.

The touch data generator 210C may further include the second capacitor Cq that is connected to the sensing line and has a predetermined capacitance value. A first electrode of the second capacitor Cq is connected to the sensing line and a predetermined voltage signal Vq is applied to a second electrode of the second capacitor Cq. The polarity of electric charges induced in the second capacitor Cq is controlled to be opposite to that of electric charges induced in a parasitic capacitance component Ct (horizontal and vertical parasitic capacitance components) present in the sensing unit SU by the capacitance of the second capacitor Cp and the voltage signal Vq. For example, if electric charges having a positive (+) polarity, which are induced in a parasitic capacitor, are supplied to the sensing line, then electric charges induced in the first electrode of the second capacitor Cq is controlled to have a negative (−) polarity. Also, if the voltage signal Vq supplied to the second electrode of the second capacitor Cq may be synchronized with the input signal Vin supplied to the second input terminal of the amplifier AMP, and in this case, the value of the voltage signal Vq may be defined as xVin. Thus, the gain of the amplifier AMP may be calculated as follows:

$$\text{gain} = \frac{1 + s(C_f + C_t + Csig + C_q - xC_q)R_f}{1 + sC_f R_f}. \quad (1)$$

n equation of calculating the gain of the amplifier AMP in a high-frequency band may be obtained from Equation (1), as follows:

$$\text{gain} = \frac{C_f + C_t + Csig + C_q - xC_q}{C_f}. \quad (2)$$

As described above, '$xC_q$' and '$C_f+C_t+C_q$' expressed in Equations (1) and (2) may be controlled to be equal to or similar to each other by adjusting the capacitance value of the second capacitor Cq and the logic level x of the voltage signal Vq. If '$xC_q$' and '$C_f+C_t+C_q$' are equal to each other, '$C_f+C_t+C_q$' and '$xC_q$' in Equation (2) offset each other, and thus, the gain of the amplifier AMP may become '$Csig/C_f$'. If '$xC_q$' and '$C_f+C_t+C_q$' are similar to each other, sensing sensitivity is improved. That is, a change in the gain of the amplifier AMP caused by the parasitic capacitance component Ct may be reduced by adjusting '$x$' and '$C_q$', thereby improving sensing sensitivity of a capacitance variation Csig when touching is made. In this case, it is unnecessary to apply the same voltage to sensing lines adjacent to the sensing line on which a sensing operation is performed.

FIG. 8B illustrates a touch data generator 210D capable of reducing influences caused by interference in a sensing line due to a change in a voltage applied to a display panel (not shown) according to another embodiment of the inventive concept. For example, if a touch screen panel is included in a mobile LCD, interference may occur due to alternation of an electrode voltage VCOM applied to an upper plate electrode of a display panel.

A vertical capacitance component Cv is generated between the sensing line and the display panel. The vertical capacitance component Cv influences an output of the amplifier AMP due to alternation of the electrode voltage VCOM applied to an upper plate electrode of the display panel alternately. To solve this problem, the input signal Vin is supplied to the second input terminal of the amplifier AMP, in synchronization with the electrode voltage VCOM. If a swing amplitude of the input signal Vin is set to be less than that of the electrode voltage VCOM, then negative (−) electric charges are gathered on an upper electrode of a vertical parasitic capacitor, e.g., an electrode connected to the sensing line when the input signal Vin is at logic high. In this case, positive (+) electric charges are gathered on an upper electrode of the second capacitor Cq by adjusting appropriately a capacitance value of the second capacitor Cq and a voltage signal Vq, where the amount of the positive (+) electric charges is equal to or similar to the amount of the negative (−) electric charges gathered on the vertical parasitic capacitor. Thus, an output of the amplifier AMP may be hardly or less affected by the vertical capacitance component Cv and a variation in the electrode voltage VCOM.

If the input signal Vin and the voltage signal Vq are synchronized with the electrode voltage VCOM, then the electrode voltage VCOM may be expressed as 'xVin' and the voltage signal Vq may be expressed as 'yVin'. In this case, the gain of the amplifier AMP of FIG. 8B may also be expressed as follows:

$$\text{gain} = \frac{1 + s[(C_f + C_{sig} + (1-x)C_v + (1-y)C_q)]R_f}{1 + sC_fR_f}. \quad (3)$$

An equation of calculating the gain of the amplifier AMP in a high-frequency band be obtained from Equation (3), as follows:

$$\text{gain} = \frac{C_f + C_{sig} + (1-x)C_v + (1-y)C_q}{C_f}. \quad (4)$$

As expressed in Equation (4), influences caused by a variation in the electrode voltage VCOM may be reduced by adjusting the capacitance value of the second capacitor Cq and the logic level x of the voltage signal Vq. For example, since the electrode voltage VCOM has a predetermined level, an output of the amplifier AMP may not be influenced or be influenced less by a variation in the electrode voltage VCOM by offsetting or reducing '$C_f+(1-x)C_v+(1-y)C_q$' expressed in Equations (3) and (4), by adjusting the capacitance value of the second capacitor Cq and the level y of the voltage signal Vq. Accordingly, in addition to reduction of influences caused by the vertical parasitic capacitance component, influences caused by an upper plate electrode voltage VCOM are reduced.

FIG. 8C is a circuit diagram of a touch data generator 210E that is another embodiment of the touch data generator 112 of FIG. 3A, 3B, or 3D according to the inventive concept. The touch data generator 210E of FIG. 8C includes all the features of the touch data generator 210B illustrated in FIG. 6A and the touch data generator 210D illustrated in FIG. 8B, and is capable of effectively reducing a horizontal and vertical parasitic capacitance component Ch and Cv generated in a sensing unit SU. In this case, the influences caused by the horizontal parasitic capacitance component are reduced as described with respect to FIG. 6A, and the influences caused by the vertical parasitic capacitance component and the voltage VCOM are reduced as described with respect to FIG. 8B. Also, although not shown, the circuit constructions of the touch data generators 210B illustrated in FIGS. 7A and 7B may be applied to the touch data generator 210E of FIG. 8C in order to effectively reduce the horizontal parasitic capacitance component Ch generated in the sensing unit SU.

Referring to FIG. 8C, parasitic capacitance components generated in the sensing unit SU may include the horizontal parasitic capacitance component Ch and the vertical parasitic capacitance component Cv. A voltage of a sensing line via which a sensing operation is performed is controlled to be equal to a voltage of a sensing line adjacent to the sensing line via which the sensing operation is performed in order to reduce the horizontal parasitic capacitance component Ch generated between adjacent sensing lines. To this end, an input voltage Vin is applied to not only an amplifier AMP that performs a sensing operation on a predetermined sensing line but also a second input terminal of another amplifier AMP corresponding to a sensing line adjacent to the predetermined sensing line. Thus, since the voltages of the predetermined sensing line and the adjacent sensing line are equal to each other, the amplifier AMP may be affected less by the horizontal capacitance component Ch. FIG. 8C illustrates that one electrode of a horizontal parasitic capacitor is connected directly to a second input terminal of the corresponding amplifier AMP, but the inventive concept is not limited thereto. For example, the one electrode of the horizontal parasitic capacitor may be electrically connected to a first or second input terminal of an amplifier AMP connected to a sensing line adjacent to the sensing line connected to the horizontal parasitic capacitor.

Figure 8D:
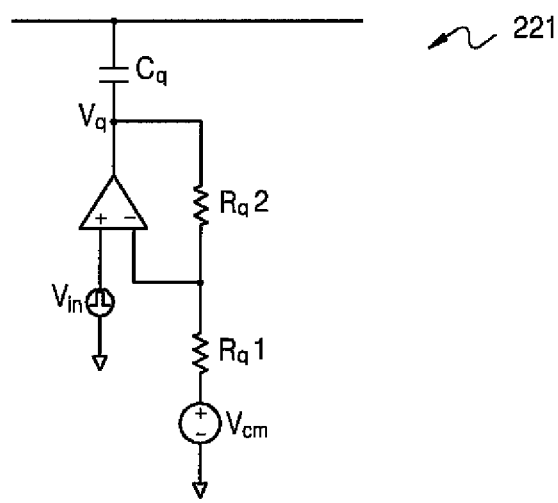

FIG. 8D is a circuit diagram of a voltage adjustment circuit 221 that adjusts the logic level of a voltage signal Vq applied to the second capacitor Cq illustrated in FIGS. 8A to 8C, according to an embodiment of the inventive concept. The voltage adjustment circuit 221 of FIG. 8D may be included in the touch data generators 210C to 210E of FIGS. 8A to 8C. The voltage adjustment circuit 221 may control the logic level of the voltage signal Vq by using an input signal Vin, a common voltage Vcm, resistors Rq1 and Rq2, and so on.

Figure 9A:
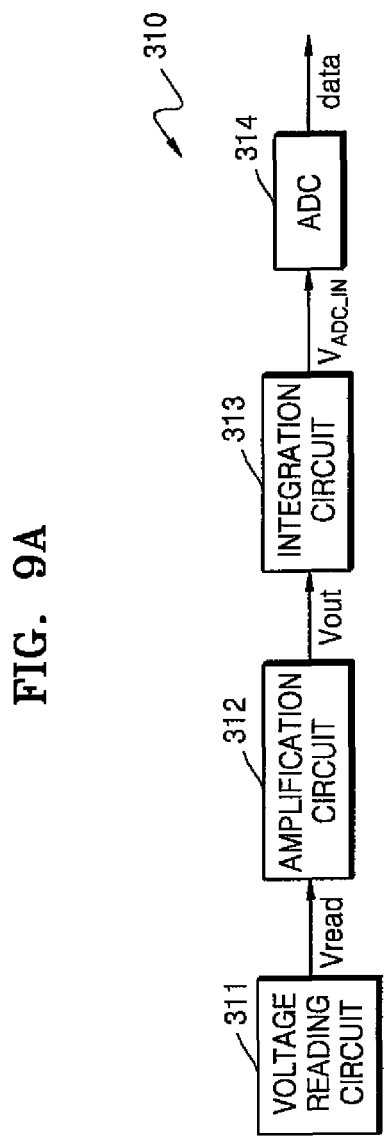
FIG. 9A and FIG. 9B are block and circuit diagrams of a touch data generator according to embodiments of the inventive concept.
Figure 9B:
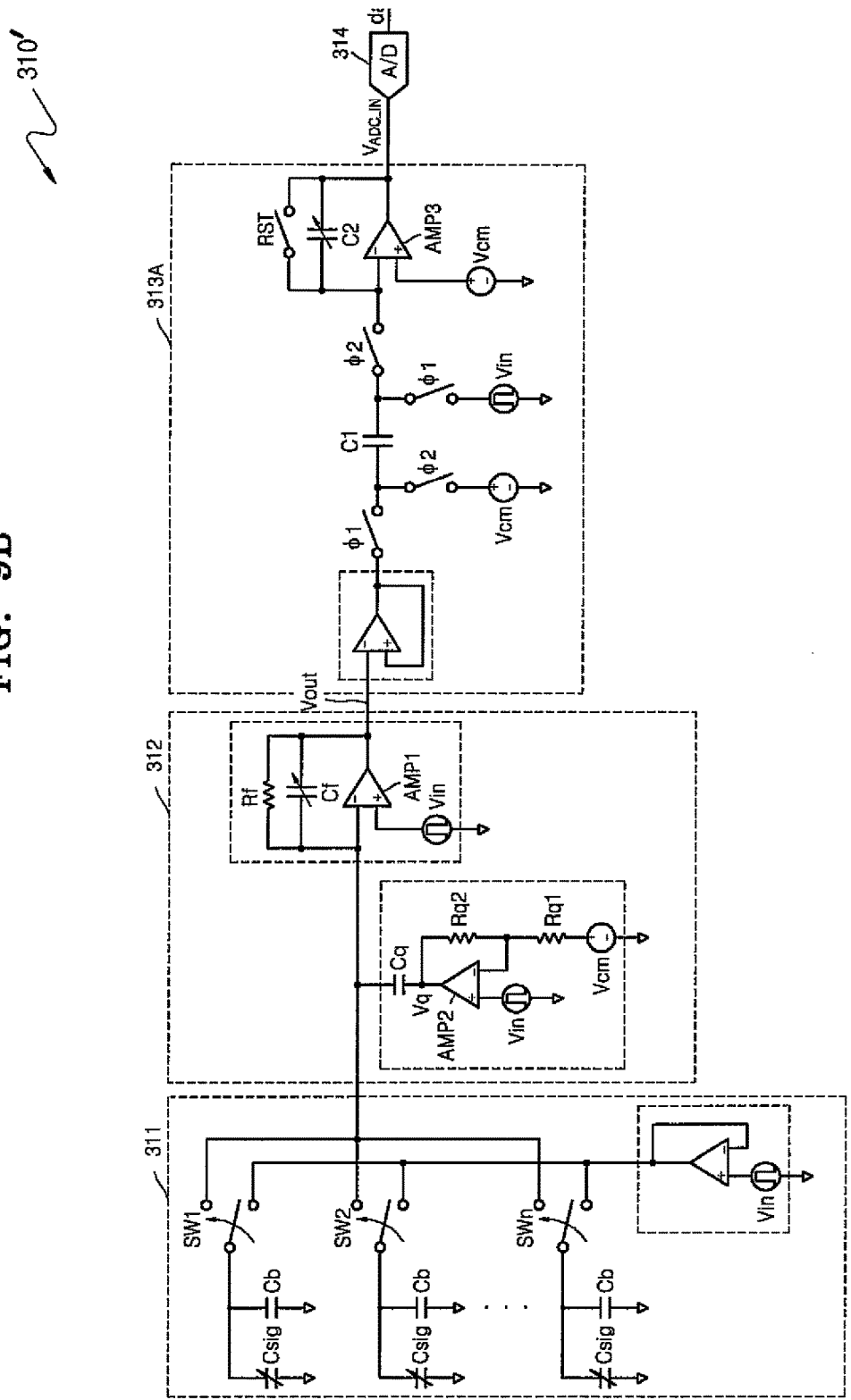
Figure 9C:
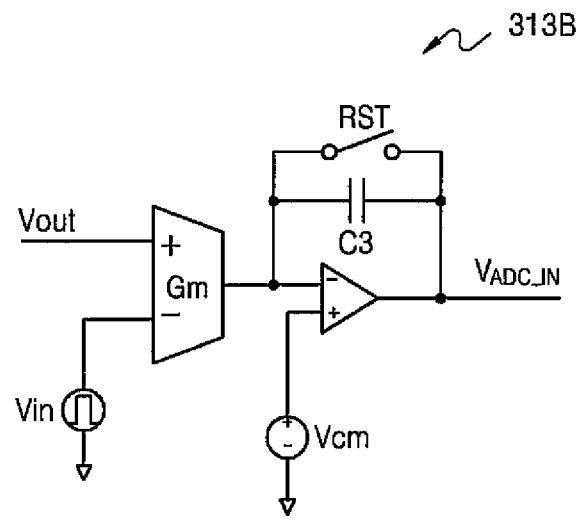
FIG. 9C is a circuit diagram of an integration circuit that is another embodiment of an integration circuit illustrated in FIG. 9A according to the inventive concept.

FIGS. 9A and 9B are block and circuit diagrams of a touch data generator 310 and 310' according to embodiments of the inventive concept. FIG. 9C is a circuit diagram of an integration circuit 313B that is another embodiment of the integration circuit 313 in FIG. 9A, according to the inventive concept. In particular, compared to the previous embodiments, the touch data generators 310 and 310' illustrated in FIGS. 9A and 9B further include the integration circuit 313.

Referring to FIG. 9A, the touch data generator 310 may include a voltage reading circuit 311, an amplification circuit 312, an integration circuit 313, and an ADC circuit 314.

Although not shown, the voltage reading circuit 311 reads a voltage Vread output from each of a plurality of sensing units connected to a plurality of sensing lines included in a touch screen panel. For example, the voltage reading circuit 311 may includes various switches and a buffer for providing an input signal Vin as illustrated in FIG. 7B.

Also, the amplification circuit 312 amplifies the voltage Vread read from the voltage reading circuit 311 and outputs the result of amplification. The result of amplification output from the amplification circuit 312 may be supplied to the integration circuit 313 as a sensing signal Vout. The amplification circuit 312 amplifies the voltage Vread output from the voltage reading circuit 311 so that a change in the capacitance of a sensing unit (not shown) may be sensed. Also, the amplification circuit 312 may include at least one amplifier for performing an amplification operation, and the at least one amplifier may include a plurality of amplifiers being respectively connected to a plurality of sensing lines. Alternatively, the at least one amplifier is switched to be connected with one of the plurality of sensing lines so that the at least one amplifier may be shared by the plurality of sensing lines.

The integration circuit 313 may integrate the sensing signal Vout received from the amplification circuit 312. As described above, the sensing signal Vout output from the amplification circuit 312 may contain a plurality of noise components, and the noise components may be effectively removed by integrating the sensing signal Vout by the integration circuit 313. In the current embodiment, the integration circuit 313 may include various types of circuits needed to receive and integrate an input signal and output the result of integration. The integration circuit 313 may one of various types of integrators, e.g., a switched capacitor integrator or a Gm-C integrator.

The ADC circuit 314 may convert an analog voltage VADC_IN received from the integration circuit 313 into touch data data which is a digital signal. Although not shown, the touch data data may be supplied to either a signal processor included in a touch controller or a host controller outside the touch controller. It is possible to determine whether the touch screen panel is touched or a touched location on the touch screen panel by performing an operation on the touch data data.

Referring to FIG. 9B, the touch data generator 310' of this example uses a switched capacitor integration circuit 313A as an integration circuit. Otherwise, as illustrated in FIG. 9C, a Gm-C integration circuit 313B may be used as an integration circuit. In the touch data generator 310 of FIG. 9B, a voltage reading circuit 311 and an amplification circuit 312 operate as described above with reference to FIG. 9A and thus are not described again here. In FIG. 9B, a capacitance component Cb generated in each of a plurality of sensing units denotes a whole capacitance component that includes horizontal and vertical parasitic capacitance components.

Referring to FIG. 9B, one amplification circuit 312 may be shared by the plurality of sensing units. When a voltage from a first sensing unit is read according to a switching operation of a first switch SW1, the remaining sensing units may be connected to an input signal Vin according to switching operations of a second switch SW2 to an $n^{th}$ switch SWn, respectively. Then, similarly, a voltage of the second sensing unit may be read and the remaining sensing units may be driven by a driving circuit (e.g., a buffer included in the voltage reading circuit 311). The input signal Vin may be a square-wave signal or a sinusoidal-wave having a predetermined pulse cycle. The logic level or frequency of the input signal Vin may be adjusted appropriately.

Figure 9D:
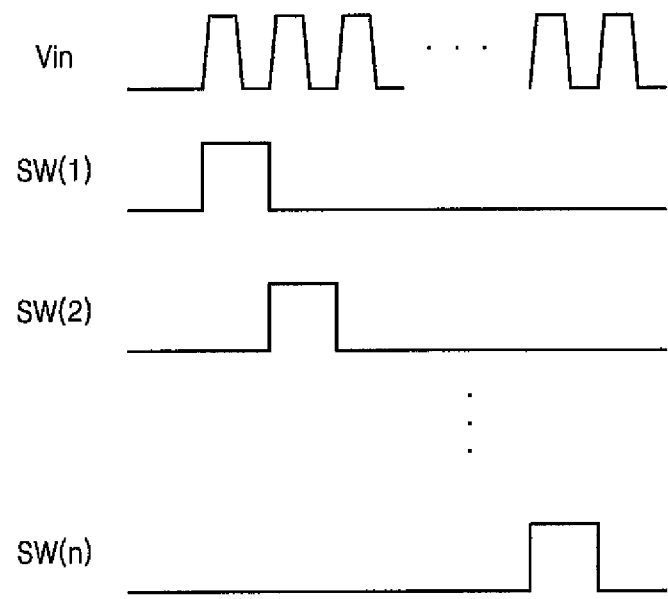
FIG. 9D is a waveform diagram illustrating an input signal Vin and a timing of turning on the switches SW1 to SWn of FIG. 9B according to an embodiment of the inventive concept.

FIG. 9D is a waveform diagram illustrating an input signal Vin and a timing of turning on the switches SW1 to SWn of FIG. 9B according to an embodiment of the inventive concept. The input signal Vin may be a square-wave signal or a sinusoidal-wave signal but FIG. 9D illustrates that the input signal Vin is a square-wave signal. Also, as illustrated in FIG. 9D, the input signal Vin may have a predetermined rising time and a predetermined falling time. Also, the switches SW1 to SWn may be sequentially turned on not to overlap with one another. Periods of time in which the switches SW1 to SWn are respectively turned on may be equal to or greater than the pulse cycle of the input signal Vin.

In FIG. 9B, the amplification circuit 312 may output an output signal Vout, the voltage level of which depends on a change in the capacitance of a sensing unit. The value of the output signal Vout of the amplification circuit 312 may be calculated as follows:

$$Vout = \frac{Vin + sR_f[(C_f + C_{sig} + C_b + C_q)Vin - V_qC_q]}{1 + sC_fR_f}. \quad (5)$$

If in Equation (5), a capacitance component Cb is completely offset, that is, when $(C_b+C_q)Vin-V_qC_q$ is satisfied, the relationship between the sensing signal Vout and the input signal Vin may be defined as follows:

$$\frac{Vout}{Vin} = \frac{1 + sR_f(C_f + C_{sig})}{1 + sR_fC_f}. \quad (6)$$

When an object touches a touch screen panel, a capacitance component Csig between the touch screen panel and the object has a predetermined intensity, and thus, a voltage of the sensing signal Vout corresponding to the capacitance component Csig may change. The amplifier AMP1 may output a sensing signal Vout corresponding to the capacitance value of a sensing unit in an analog manner. Whether the touch screen panel is touched and a touched location on the touch screen panel may be determined by sensing a change in the voltage of the sensing signal Vout, caused when the touch screen panel is touched.

A noise may be contained in the sensing signal Vout output from the amplification circuit 312, and the integration circuit 313A included in a touch controller according to an embodiment of the inventive concept may reduce influences caused by the noise effectively. In general, noise has a Gaussian distribution, and thus, an average of the values of noise components in a predetermined section may be zero. Thus, it is possible to effectively remove the noise from an output voltage Vout by using a predetermined integration circuit.

The integration circuit 313A may include an operation amplifier AMP3 in order to perform an integration operation. A capacitor C2 may be connected between a first input terminal, e.g., a negative input terminal, and an output terminal of the operation amplifier AMP3. A switch RST may also be connected between the first input terminal and the output terminal of the operating amplifier AMP3 to be parallel to the capacitor C2.

Also, a common voltage Vcm may be applied to a second input terminal, e.g., a positive input terminal, of the operation amplifier AMP3. The common voltage Vcm may correspond to an intermediate level of voltage input to the ADC circuit 314.

Also, a plurality of switches φ1 and φ2 and a capacitor C1 may be connected to the first input terminal, e.g., the negative input terminal, of the operation amplifier AMP3. An integration operation may be performed based on switching operations of the switches φ1 and φ2 and a charging operation of the capacitor C1. The output voltage Vout of the amplification circuit 312 may be supplied to the inside of the integration circuit 313A via a predetermined buffer.

Figure 9E:
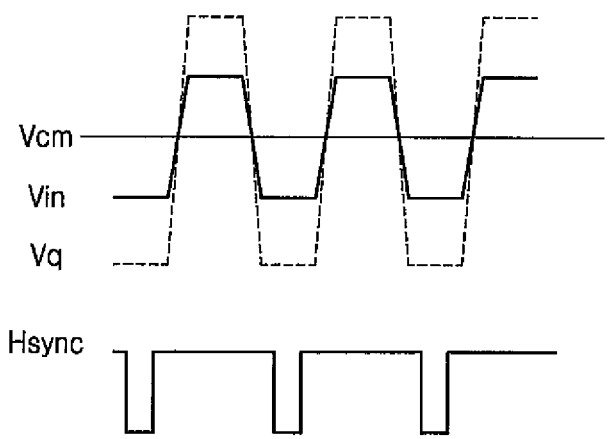
FIG. 9E is a waveform diagram of various signals supplied to the touch controller of FIG. 9B according to an embodiment of the inventive concept.

FIG. 9E is a waveform diagram of various signals supplied to the touch controller according to an embodiment of the inventive concept. A common voltage Vcm having a predetermined level may be applied, and an input signal Vin and a voltage signal Vq supplied to a capacitor Cq may have a predetermined frequency and a voltage having an intermediate level corresponding the common voltage Vcm. For example, FIG. 9E illustrates a case where the input signal Vin and the voltage signal Vq are generated in synchronization with a horizontal synchronization signal HSYNC.

The voltage signal Vq may be controlled using values of the resistors Rq1 and Rq2 connected to amplifier AMP2, and influences caused by a capacitance component Cb generated in a sensing unit may be reduced by adjusting the logic level of the voltage signal Vq.

Figure 9F:
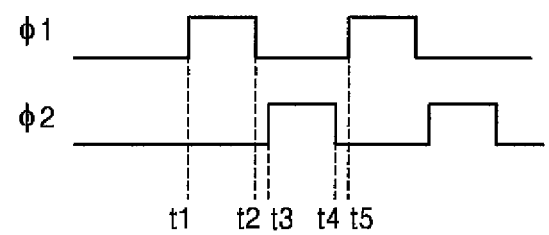
FIG. 9F is a timing diagram illustrating the operation of the integration circuit of FIG. 9B according to an embodiment of the inventive concept.

FIG. 9F is a timing diagram illustrating the operation of the integration circuit 313A of FIG. 9B according to an embodiment of the inventive concept. As illustrated in FIG. 9F, two switches φ1 may be controlled in the same way and the remaining switches φ2 may be controlled in the same way. First, the switches φ1 may be turned on at a time t1, and the capacitor C1 may thus be charged with the difference between the input signal Vin and the output voltage Vout.

While a predetermined voltage is charged in the capacitor C1, the switches φ1 may be turned off and the remaining switches φ2 may be turned on at a time t2. In this case, the operation amplifier AMP3 may perform an integration operation so that a voltage of the first input terminal, e.g., a negative input terminal, of the amplifier AMP3 may follow a voltage of the second input terminal, e.g., a positive input terminal, thereof. Thus, an integration voltage VADC_IN may increase or decrease according to the difference between the output voltage Vout and the input signal Vin. When the output voltage Vout is entirely integrated, the result of integration may not fall within the dynamic range of the ADC circuit 314, and thus, according to an embodiment of the inventive concept, a voltage 'Vout−Vin' may be integrated according to time, as illustrated in FIG. 9B. Thus, the result of integrating the voltage 'Vout−Vin' may be less than or greater than the common voltage Vcm. That is, a voltage of an input signal supplied to the ADC circuit 314 is set to be less than or greater than the common voltage Vcm, and thus, an output of the ADC circuit 314 may be averaged, thereby removing a low-frequency noise effectively.

Figure 9G:
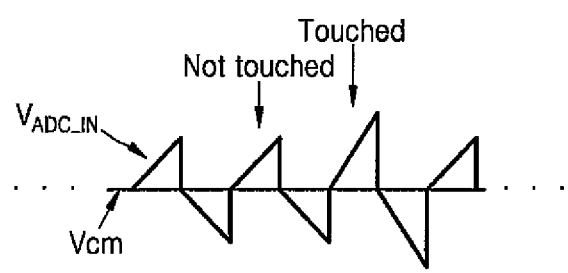
FIG. 9G is a graph showing a variation in an integration voltage of the integration circuit of FIG. 9B according to embodiment of the inventive concept.

FIG. 9G is a graph showing a variation in an integration voltage VADC_IN of the integration circuit 313A of FIG. 9B according to embodiment of the inventive concept. Referring to FIG. 9G, the integration voltage VADC_IN may be output to be less than or greater than the common voltage Vcm. For example, if the output voltage Vout is greater than a voltage of the input signal Vin, the integration voltage VADC_IN may be greater than the common voltage Vcm, and if the output voltage Vout is less than the voltage of the input signal Vin, the integration voltage VADC_IN may be less than the common voltage Vcm. Also, as illustrated in FIG. 9G, the integration voltage VADC_IN is not influenced by noise, and thus, a controller (not shown) may easily determine whether a touch screen panel is touched by setting a threshold appropriately.

Figure 10A:
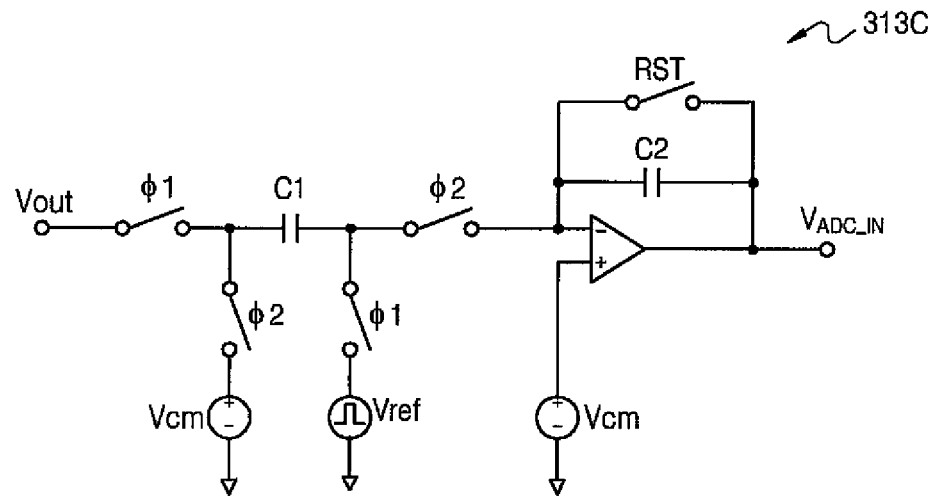
FIG. 10A is a circuit diagram of another embodiment of the integration circuit included in the touch data generator of FIG. 9B, according to the inventive concept.

FIG. 10A is a circuit diagram of an integration circuit 313C that is another embodiment of the integration circuit 313A included in the touch data generator 310 of FIG. 9B, according to the inventive concept. Referring to FIG. 10A, the integration circuit 313C uses a reference signal Vref as an input signal instead of the input signal Vin used in the embodiment of FIG. 9B. The integration circuit 313C of FIG. 10A is a switched capacitor integration circuit but it may be embodied as a Gm-C integration circuit.

Figure 10B:
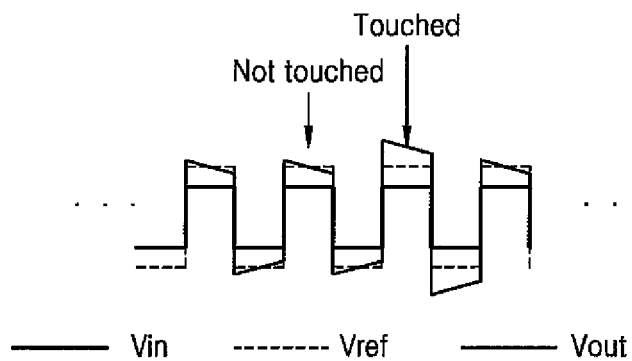
FIG. 10B is a waveform diagram of an output voltage Vout and the voltage reference signal Vref used in the integration circuit of FIG. 10A, and an input signal Vin, according to an embodiment of the inventive concept.
Figure 10B:
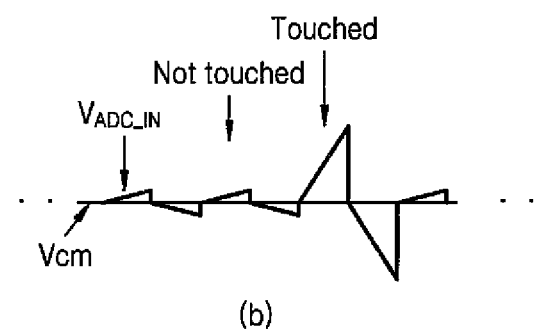

FIG. 10B is a waveform diagram of an output voltage Vout and the reference signal Vref used in the integration circuit 313C of FIG. 10A, and an input signal Vin, according to an embodiment of the inventive concept. The reference signal Vref may be embodied as a square-wave signal or a sinusoidal-wave signal as the input signal Vin, and an amplitude of the reference signal Vref may be greater than that of the input signal Vin.

Referring to FIG. 10B(a), the amplitude of the reference signal Vref may be set to correspond to an intermediate level of an inclined section of the output voltage Vout, so that an integration voltage VADC_IN when touching is not made may approximate nearly a common voltage Vcm. Also, FIG. 10B(b) reveals if reference signal Vref is used instead of the input signal Vin, then the integration voltage VADC_IN when touching is not made approximates more the common voltage Vcm. Thus, sensing sensitivity may be improved greatly by increasing the difference of the integration voltages VADC_IN between when touching is not made and when touching is made.

Figure 11:
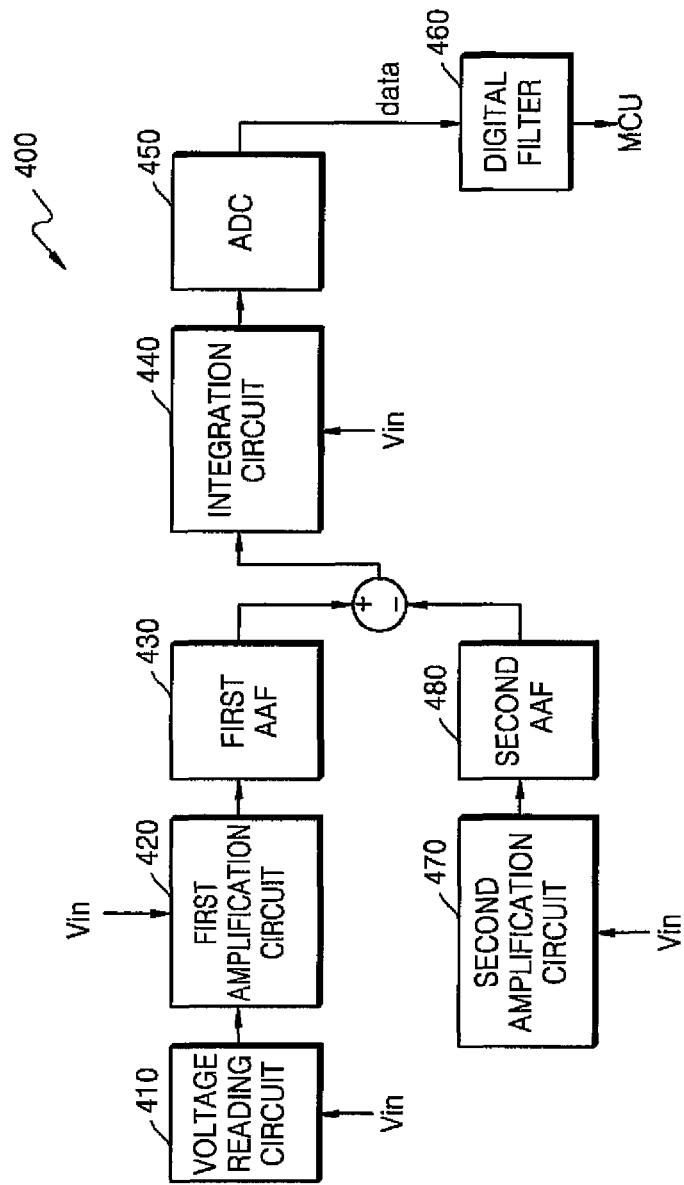
FIG. 11 is a block diagram of a touch controller according to another embodiment of the inventive concept.

FIG. 11 is a block diagram of a touch controller 400 according to another embodiment of the inventive concept. Referring to FIG. 11, the touch controller 400 includes elements for performing operations to generate touch data. For example, the touch controller 400 includes a voltage reading circuit 410, a first amplification circuit 420, a first anti-aliasing filter (AAF) 430, an integration circuit 440, and an ADC 450. The touch controller 400 may further include a second amplification circuit 470 that has the same or similar characteristics as the first amplification circuit 420, and a second AAF 480 that has the same or similar characteristics as the first AAF 430. A main signal path is formed using the first amplification circuit 420 and the first AAF 430, and a sub signal path is formed using the second amplification circuit 470 and the second AAF 480.

When the capacitance of a sensing unit (not shown) changes, an output voltage corresponding to the change in the capacitance is generated using the voltage reading circuit 410 and the first amplification circuit 420. The output voltage output from the first amplification circuit 420 may pass through the first AAF 430. Touch data data generated by the ADC 450 may pass through a digital filter 460 in a subsequent operation. In this case, before passing through the digital filter 460, the touch data data may pass through an AAF so that a high-frequency component may be removed from the touch data data. To this end, the first AAF 430 may be disposed between the first amplification circuit 420 and the integration circuit 440.

A plurality of signals that indicate a change in the capacitances of a plurality of sensing units (not shown), respectively, are supplied sequentially to the voltage reading circuit 410. In order to sense a change in the capacitances of the plurality of sensing units, a plurality of pulse signals each having a particular frequency corresponding to one of the plurality of sensing units are supplied to the voltage reading circuit 410. The second amplification circuit 470 and the second AAF 480 may be further included in the touch controller 200 in order to extract only an actual signal component from an output of the first AAF 430. Also, a pulse signal, e.g., an input signal Vin, the phase of which is the same as that of a pulse signal supplied to first amplification circuit 420 is supplied to the second amplification circuit 470. Although not shown, a voltage of the sensing unit is applied to one input terminal of an amplifier included in the first amplification circuit 420, where an amplifier included in the second amplification circuit 470 may have a structure in which one input terminal is connected to an output terminal. The difference between an output of the first AAF 430 and an output of the second AAF 480 is calculated by a predetermined subtractor, and thus, only an actual signal component is supplied to the integration circuit 440.

The frequencies of pulse signals supplied to the elements of the touch controller 400 of FIG. 11 may be synchronized with a line scan frequency of a display (not shown) in order to minimize frequency interferences during a displaying operation. For example, the input signal Vin supplied to the voltage reading circuit 410 may also be supplied to the first amplification circuit 420, the second amplification circuit 470 and the integration circuit 440. Also, a voltage signal, the phase of which is equal or similar to the phase of the input signal Vin and the amplitude of which is different from the amplitude of the input signal Vin, may be supplied to the first amplification circuit 420, the second amplification circuit 470, and the integration circuit 440.

Figure 12A:
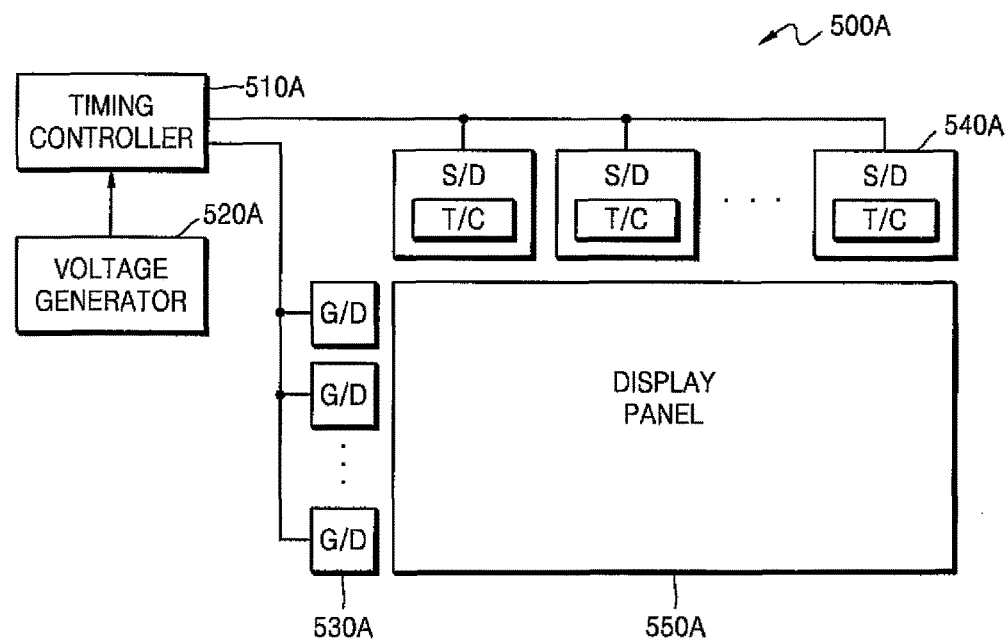
FIG. 12A is a block diagram of a general LCD that includes a plurality of touch controllers according to an embodiment of the inventive concept.

FIG. 12A is a block diagram of a general LCD 500A that includes a plurality of touch controllers T/C according to an embodiment of the inventive concept. Referring to FIG. 12A, the LCD 500A may include a timing controller 510A that controls the overall timing for displaying an image and a voltage generator 520A that generates various voltages for driving the LCD 500A. The LCD 500A may further include a display panel 550A, at least one gate driver 530A that drives a gate line of the display panel 550A, and at least one source driver 540A that drives a source line of the display panel 550A. Each of the touch controllers T/C may receive timing information from the timing controller 510A. Thus, the touch controllers T/C may be included in the at least one gate driver 530A or the at least one source driver 540A, respectively. FIG. 12A illustrates that the touch controllers T/C are included, for example, in the at least one source driver 540A, respectively. The timing information transmitted from the timing controller 510A to the source driver 540A may be supplied simultaneously to the touch controllers T/C included in the at least one source driver 540A. The touch controllers T/C sense a capacitance value of a sensing unit of a touch screen panel (not shown) that may be attached to the display panel 550A, and generate touch data from the timing information received from the timing controller 510A.

Figure 12B:
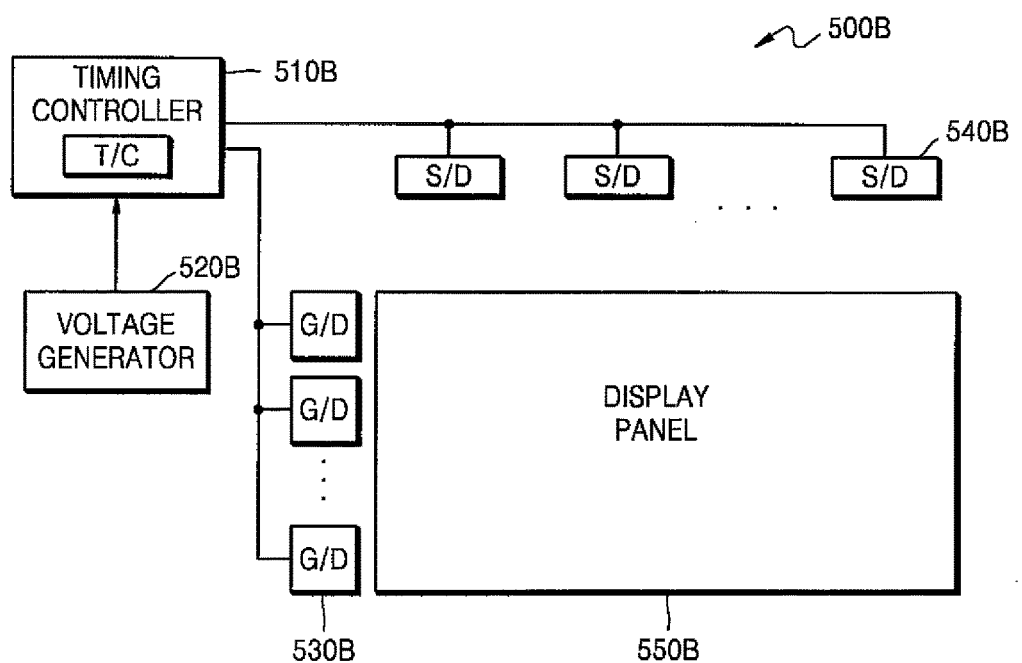
FIG. 12B is a block diagram of a general LCD that includes a touch controller according to another embodiment of the inventive concept.

FIG. 12B is a block diagram of a general LCD 500B that includes a touch controller T/C according to an embodiment of the inventive concept. Referring to FIG. 12B, in the LCD 500B, the touch controller T/C is included in a timing controller 510B. In this case, the touch controller T/C may receive timing information directly in the timing controller 510B. Although not shown, the touch controller T/C may be electrically connected to a touch screen panel that may be attached to a display panel 550B, and thus may sense a change in the capacitance of a sensing unit of the touch screen panel and generate touch data according to the change in the capacitance.

Figure 13:
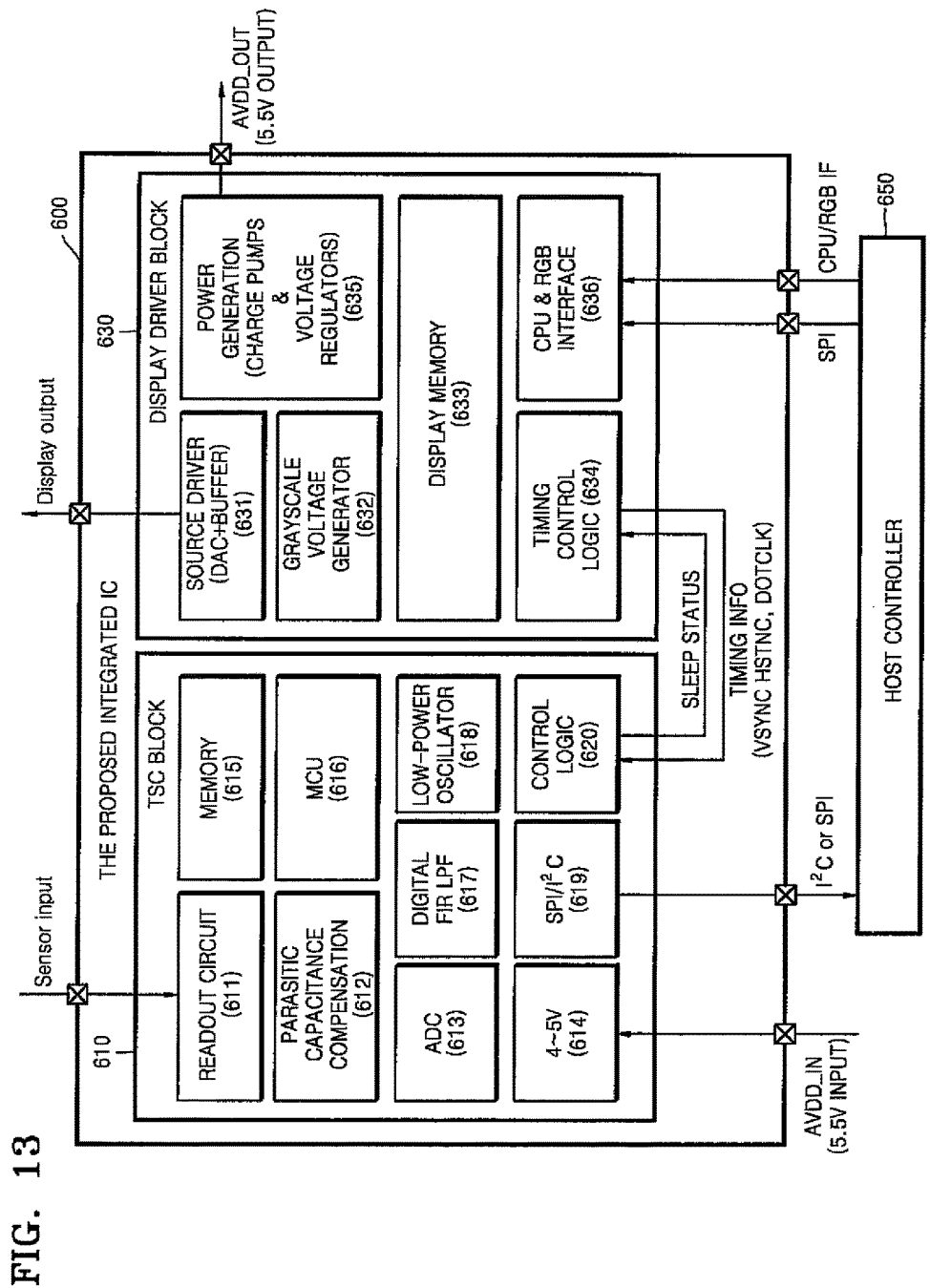
FIG. 13 is a block diagram of an integrated circuit (IC), in which a touch controller and a display driving unit are integrated together, according to an embodiment of the inventive concept.

FIG. 13 is a block diagram of an integrated circuit (IC) 600, in which a touch controller 610 and a display driving unit 630 are integrated together, according to an embodiment of the inventive concept. In FIG. 13, the IC 600 is embodied as a semiconductor chip that communicates with a host controller 650. The semiconductor chip 600 includes the touch controller 610 as described above in the previous embodiments, and the display driving unit 630 that acts as a display driving circuit. Since the touch controller 610 and the display driving unit 630 are integrated together in the same semiconductor chip 600, manufacturing costs may be saved. Also, a sensing signal output from the touch controller 610 and a signal output from the display driving unit 630 may be synchronized with each other, thereby reducing influences caused by noise generated during a touch screen operation.

The touch controller 610 may be constructed in various ways in order to perform the touch screen operation. For example, the touch controller 610 may include a readout circuit 611 that generates touch data, a parasitic capacitance compensation circuit 612 that reduces a parasitic capacitance component in a sensing unit, an ADC 613 that converts analog data into a digital signal, a supply voltage generator 614 that generates a supply voltage, a memory unit 615, an MCU 616, a digital FIR LPF 617, an oscillator 618 that generates a low-power oscillation signal, an interface unit 619 that exchanges a signal with the host controller 650, and a control logic unit 620. The display driving unit 630 may include a source driver 631 that generates gray-scale data for a displaying operation, a gray-scale voltage generator 632, a display memory 633 that stores display data, a timing control logic unit 634, and a power generator 635 that generates at least one supply voltage. The display driving unit 630 may further include a central processing (CPU) and RGB interface unit 636 that controls the overall operations of the display driving unit 630 or performs an interface with the host controller 650.

The touch controller 610 may receive at least one piece of timing information Timing info from the display driving unit 630. For example, the control logic unit 620 of the touch controller 610 receives various timing information VSYCN, HSYCN, and Dotclk to be synchronized with a display output signal from the timing control logic unit 634 of the display driving unit 630. The control logic unit 620 may generate a control signal for controlling a timing of generating the touch data, from the at least one piece of timing information Timing info.

The display driving unit 630 may also receive at least one piece of information from the touch controller 610. Referring to FIG. 13, the display driving unit 630 may receive a status signal, e.g., a sleep status signal, from the touch controller 610. The display driving unit 630 receives the sleep status signal from the touch controller 610 and performs an operation corresponding to the sleep status signal. If the touch controller 610 enters a sleep mode, it means that touching has not been made for a predetermined time. In this case, the display driving unit 630 may discontinue supplying the timing information Timing info to the touch controller 610. Therefore, it is possible to save power consumption in a device, e.g., a mobile device, in which the semiconductor chip 600 is installed.

Also, as illustrated in FIG. 13, each of the touch controller 610 and the display driving unit 630 includes a circuit block that generates power, a memory that stores predetermined data, and a control unit that controls the operations of the remaining blocks. Thus, if the touch controller 610 and the display driving unit 630 are integrated together in the same semiconductor chip, then the memory, the circuit block, and the control unit may be embodied to be used commonly by the touch controller 610 and the display driving unit 330.

Figures 14A, 14B:
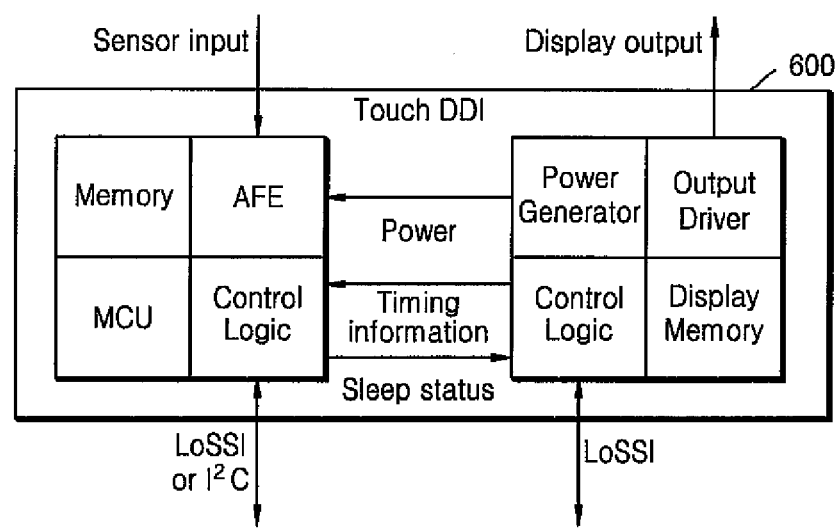
FIGS. 14A and 14B illustrate an interrelation between a touch controller and a display driving unit as illustrated in FIG. 13.

FIGS. 14A and 14B illustrate an interrelation between a touch controller and a display driving unit as illustrated in FIG. 13. Referring to FIG. 14A, a semiconductor chip 600 that drives a display device (not shown) may include the touch controller (including the memory, AFE, MCU and control logic as shown for example) and the display driving unit (including the power generator, output driver, control logic and display memory as shown for example), and the touch controller and the display driving unit may exchange at least one piece of information, e.g., timing information and status information, with each other. Also, each of the touch controller and the display driving unit may supply a supply voltage to the other or may receive the supply voltage from the other. FIG. 14A schematically illustrates the touch controller and the display driving unit for convenience of explanation, in which an analog front end (AFE) included in the touch controller may include a voltage reading circuit, an amplification circuit, an integration circuit, and an ADC. A case where the touch controller provides sleep status information to the display driving unit and the display driving unit applies the supply voltage to the touch controller according to an embodiment of the inventive concept, will now be described.

As illustrated in FIG. 14B, if a display is turned off and a touch input is deactivated, i.e., if both the touch controller and the display enter a sleep mode, then the display driving unit prevents a supply voltage or timing information from being supplied to the touch controller. In this case, only a register included in the display driving unit may be activated, thereby minimizing power consumption.

If the touch input is deactivated and the display is activated, i.e., if the touch controller enters the sleep mode and the display enters a normal mode, then the display driving unit generates the supply voltage to be used therein but the supply voltage is not applied to the touch controller since the touch controller does not consume power. Also, the display driving unit does not provide the timing information to the touch controller.

If the touch input is activated and the display is deactivated, i.e., if the touch controller enters the normal node and the display enters the sleep mode, then it is periodically checked whether touching is made since the touch input is activated. In this case, the display driving unit is kept deactivated while operating in a low-power consumption mode. However, in order to check whether touching is made, the display driving unit generates the timing information and the supply voltage to be applied to the touch controller and supply them to the touch controller.

In general, when both the touch input and the display are activated, i.e., if both the touch controller and the display enter the normal mode, then the display driving unit generates the timing information and the supply voltage and applies them to the touch controller.

It is concluded from the above four cases that the supply voltage generator of the display driving unit may generate a supply voltage when at least one of the touch controller and the display driving unit is activated. Also, a control logic unit of the display driving unit may generate the timing information and supply it to the touch controller only when the touch controller operates.

Figure 15A:
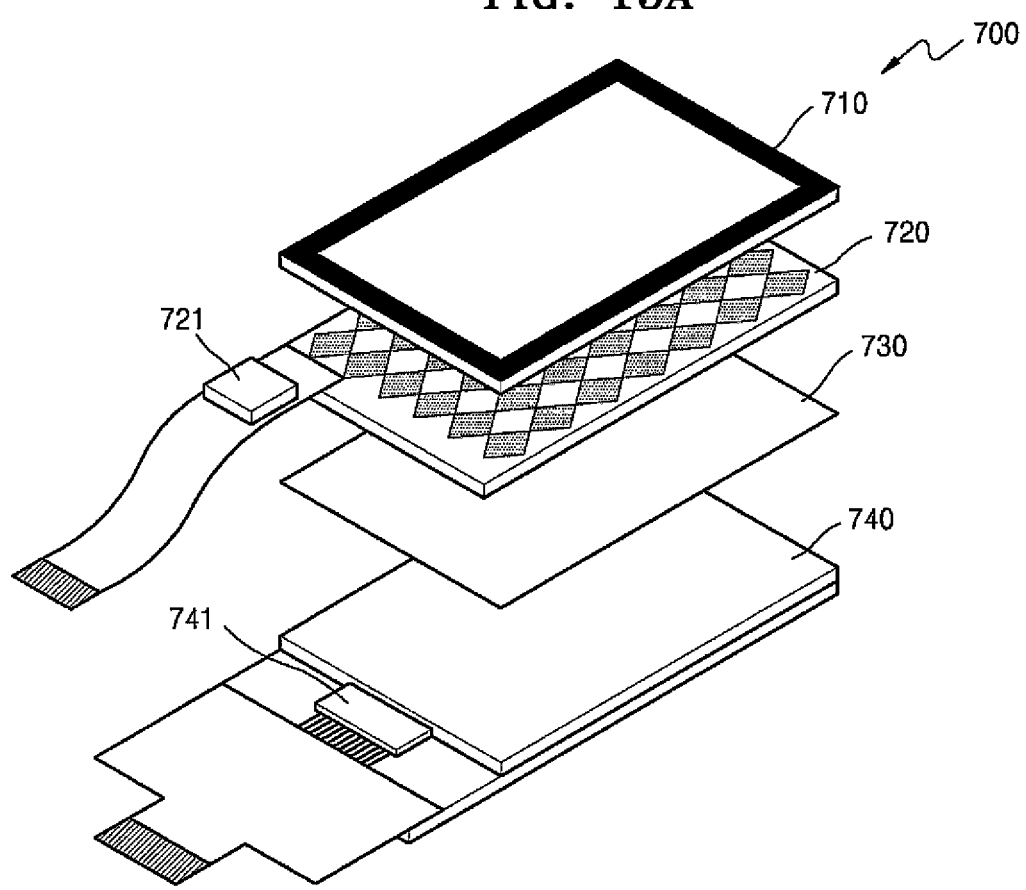
FIGS. 15A to 15C illustrate embodiments of a printed circuit board (PCB) structure of a display device that includes a touch panel, according to the inventive concept.
Figure 15B:
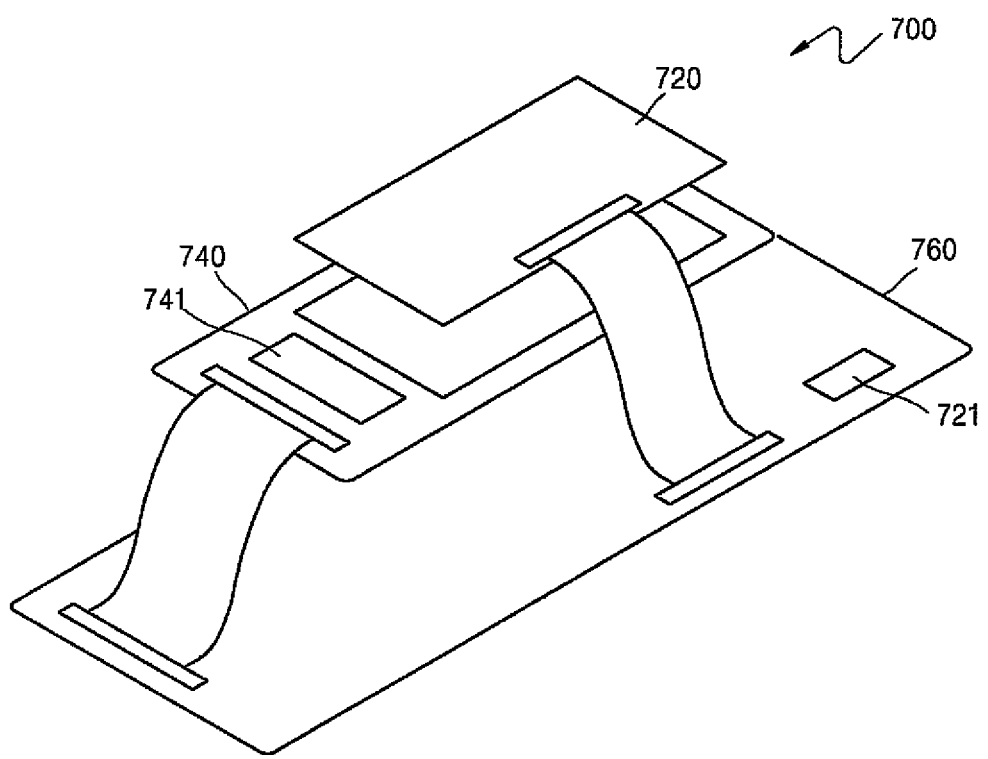
Figures 15C, 15D:
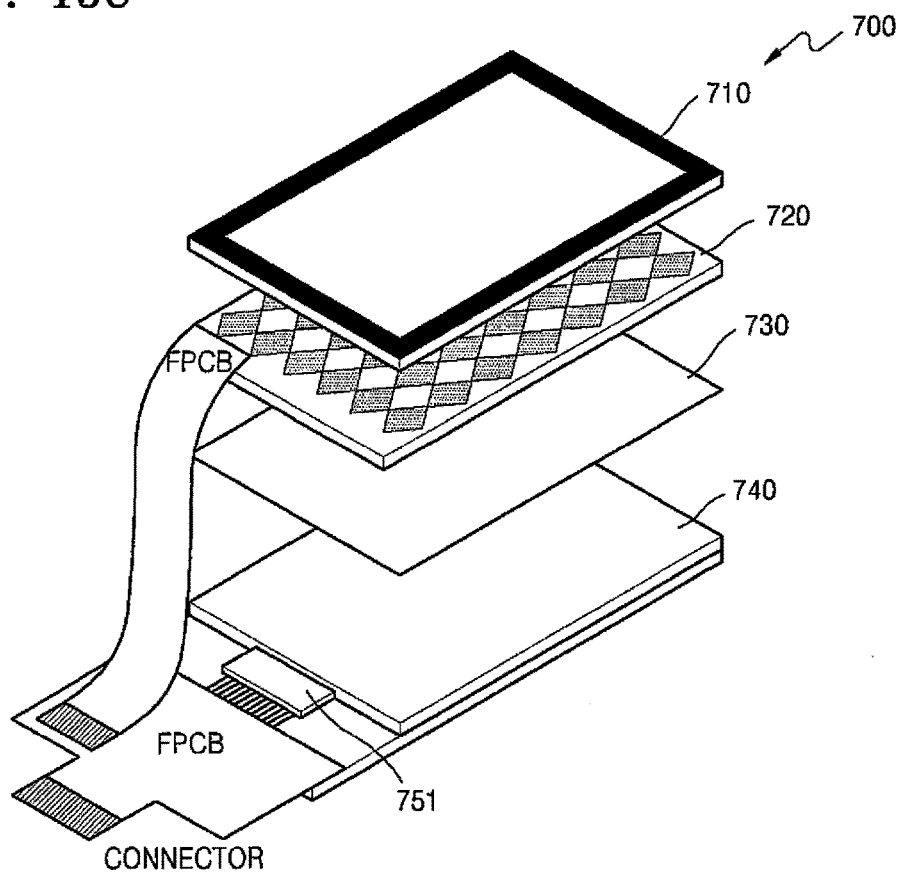
FIG. 15D illustrates the panel structure of the display device illustrated in FIG. 15A, 15B, or 15C, according to an embodiment of the inventive concept.

FIGS. 15A to 15C illustrate embodiments of a printed circuit board (PCB) structure of a display device 700 that includes a touch panel 720, according to the inventive concept. Here, the touch panel 720 and a display panel 740 are disposed apart from each other.

Referring to FIG. 15A, the display device 700 may include a window glass 710, the touch panel 720, and the display panel 740. A polarizing plate 730 may be disposed between the touch panel 720 and the display panel 740 for an optical characteristic.

In general, the window glass 710 is formed of acryl or tempered glass and protects a module from external impacts or scratches caused by repeated touches. The touch panel 720 is formed by patterning transparent electrodes, for example, indium tin oxide (ITO) electrodes, on a glass substrate or a polyethylene terephthlate (PET) film. A touch screen controller 721 may be mounted on a flexible printed circuit board (FPCB) in the form of a chip on board (COB), and senses a change in the capacitance of each of the electrodes, extracts the coordinates of a touching point, and provides the coordinates of the touching point to a host controller (not shown). In general, the display panel 740 is manufactured by putting two pieces of glass, i.e., an upper glass plate and a lower glass plate, together. Also, in general, the display driving circuit 741 is attached to a mobile display panel in the form of a chip on glass (COG).

FIG. 15B illustrates another embodiment of the PCB structure of the display device 700 that includes a touch panel 720, according to the inventive concept. Referring to FIG. 15B, a touch controller 721 may be disposed on a main board 760 and a voltage signal transmitted from a sensing unit (not shown) may be exchanged between the touch panel 720 and the touch controller 721 via an FPCB. A display driving circuit 741 may be mounted on a display panel 740 in the form of a COG as illustrated in FIG. 15A. The display driving circuit 741 may be electrically connected to the main board 760 via the FPCB. That is, the touch controller 721 and the display driving circuit 741 may exchange various information and signals with each other via the main board 760.

FIG. 15C illustrates another embodiment of the PCB structure of the display device 700, in which a touch controller and a display driving unit are integrated together in the same semiconductor chip 751, according to the inventive concept. Referring to FIG. 15C, the display device 700 may include a window glass 710, a touch panel 720, a polarizing plate 730, and a display panel 740. In particular, the semiconductor chip 751 may be mounted on a display panel 740 in the form of COG. The touch panel 720 and the semiconductor chip 751 may be electrically connected to each other via an FPCB.

FIG. 15D illustrates the panel structure of the display device 700 illustrated in FIG. 15A, 15B, or 15C, according to an embodiment of the inventive concept. FIG. 15D illustrates an organic light-emitting diode (OLED) as the display device 700. Referring to FIG. 15D, a sensing unit may be formed by patterning a transparent electrode, e.g., an ITO (sensor) and may be formed on a glass plate separated apart from a display panel. The glass plate on which the sensing unit is disposed may be separated apart from a window glass via a predetermined air gap or resin, and may be separated apart from an upper glass plate and a lower glass plate that constitute the display panel via a polarizing plate.

Figure 16A:
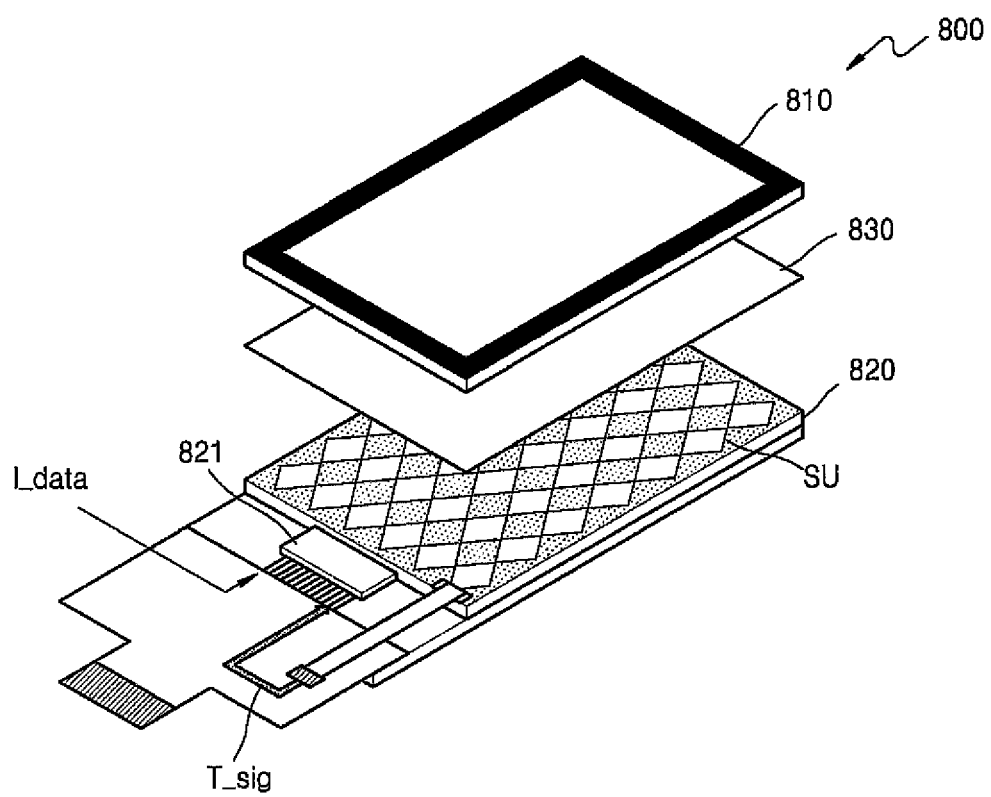
FIGS. 16A to 16C illustrate embodiments of a PCB structure of a display device 800, in which a touch panel and a display panel are united together, according to the inventive concept.
Figure 16B:
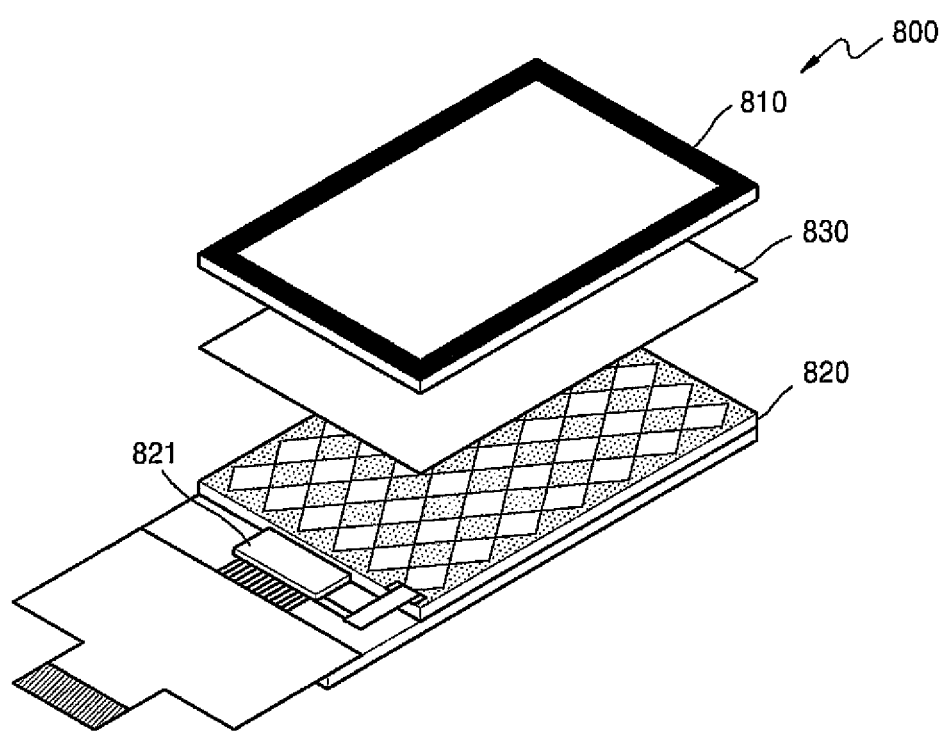
Figure 16C:
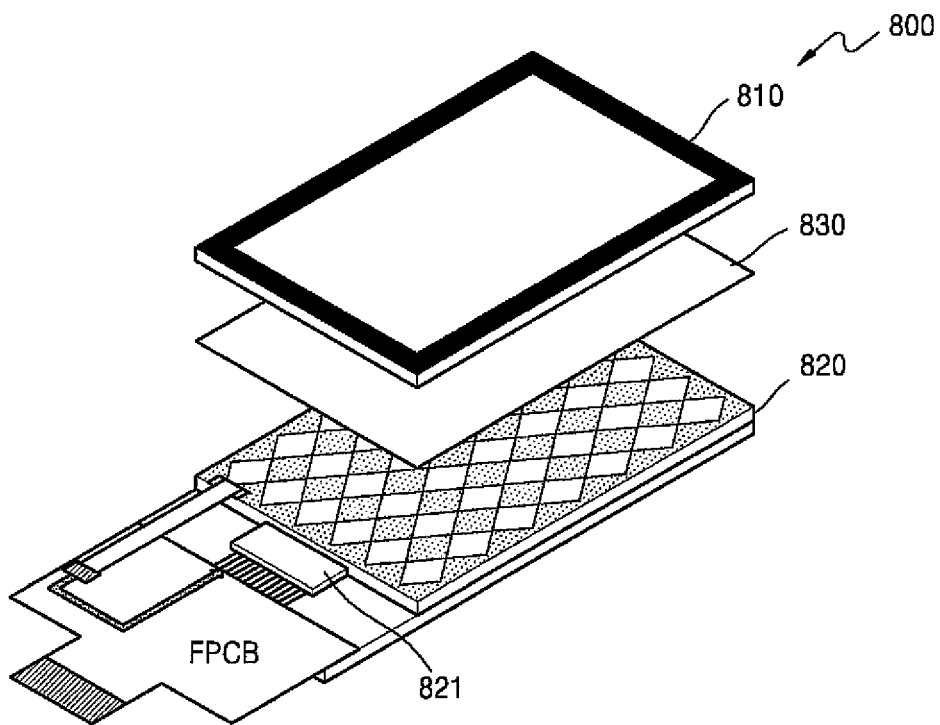

FIGS. 16A to 16C illustrate embodiments of a PCB structure of a display device 800, in which a touch panel and a display panel are united together, according to the inventive concept. Referring to FIG. 16A, the display device 800 may include a window glass 810, a display panel 820, and a polarizing plate 830. In particular, the touch panel may be fabricated by patterning transparent electrodes on an upper glass plate of the display panel 820 rather than on an additional glass plate. FIG. 16A illustrates that a plurality of sensing units SU are arranged on the upper glass plate of the display panel 820. Although not shown, when a panel structure is fabricated as described above, a touch controller and a display driving circuit may be integrated together in the same semiconductor chip 821.

If the touch controller and the display driving circuit may be integrated together in the same semiconductor chip 821, then a voltage signal T_sig and image data I_data are supplied to the semiconductor chip 821 from each of the sensing units SU and an external host, respectively. Also, the semiconductor chip 821 processes the image data I_data, generates gray-scale data (not shown) for actually driving the display device 800, and supplies the gray-scale data to the display panel 820. To this end, the semiconductor chip 821 may include pads related to touch data and pads related to the image data I_data and the gray-scale data. The semiconductor chip 821 receives the voltage signal T_sig from each of the sensing units SU via a conductive line connected to one side of the touch panel. When the pads are arranged on the semiconductor chip 821, the pad for receiving the voltage signal T_sig may be located adjacent to the conductive line for delivering the voltage signal T_sig in order to reduce noise in data. Although not shown in FIG. 16A, if the conductive line for supplying the gray-scale data to the display panel 820 is disposed to be opposite to a conductive line for supplying a touch data voltage signal T_sig, then the pad for providing the gray-scale data may also be located to be opposite to pads for receiving the voltage signal T_sig.

The display device 800 of FIG. 16B has a construction similar to that of the display device of FIG. 16A. Referring to FIG. 16B, a voltage signal transmitted from a sensing unit is supplied directly to a semiconductor chip 821 via a conductive line rather than via an FPCB.

The display device 800 of FIG. 16C also has a construction similar to that of the display device of FIG. 16A. However, referring to FIG. 16C, in the display device 800, a signal path in which a voltage signal transmitted from a sensing unit to a semiconductor chip 821 is different from in the display device of FIG. 16A. In the current embodiment, a pad for receiving the voltage signal from the sensing unit is disposed closest to a conductive line from among a plurality of pads arranged on the semiconductor chip 821.

Figure 16D:
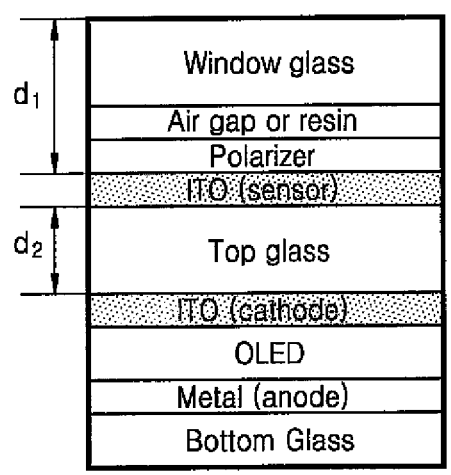
FIG. 16D illustrates the panel structure of the display device illustrated in FIG. 16A, 16B, or 16C, according to another embodiment of the inventive concept.

FIG. 16D illustrates the panel structure of the display device 800 illustrated in FIG. 16A, 16B, or 16C, according to another embodiment of the inventive concept. In a display device according to an embodiment of the inventive concept, a touch panel and a display panel may be effectively united together. Referring to FIG. 16D, an OLED is embodied as the display device 800. In the current embodiment, a sensing unit is fabricated by forming a transparent electrode, e.g., an ITO (sensor), directly on an upper glass plate of the display panel, rather than on an additional glass plate or on a PET film. In this case, a touch display panel may be fabricated while reducing manufacturing costs and module thickness, but the distance between the transparent electrode and a top glass of the display device 800 becomes small, thereby increasing a vertical parasitic capacitance component in the sensing unit. However, according to the above embodiments, it is possible to reduce influences, caused by the whole parasitic capacitance components including a vertical parasitic capacitance component generated in a sensing unit. Accordingly, as described above, the touch panel and the display panel may be united together effectively.

Figure 17A:
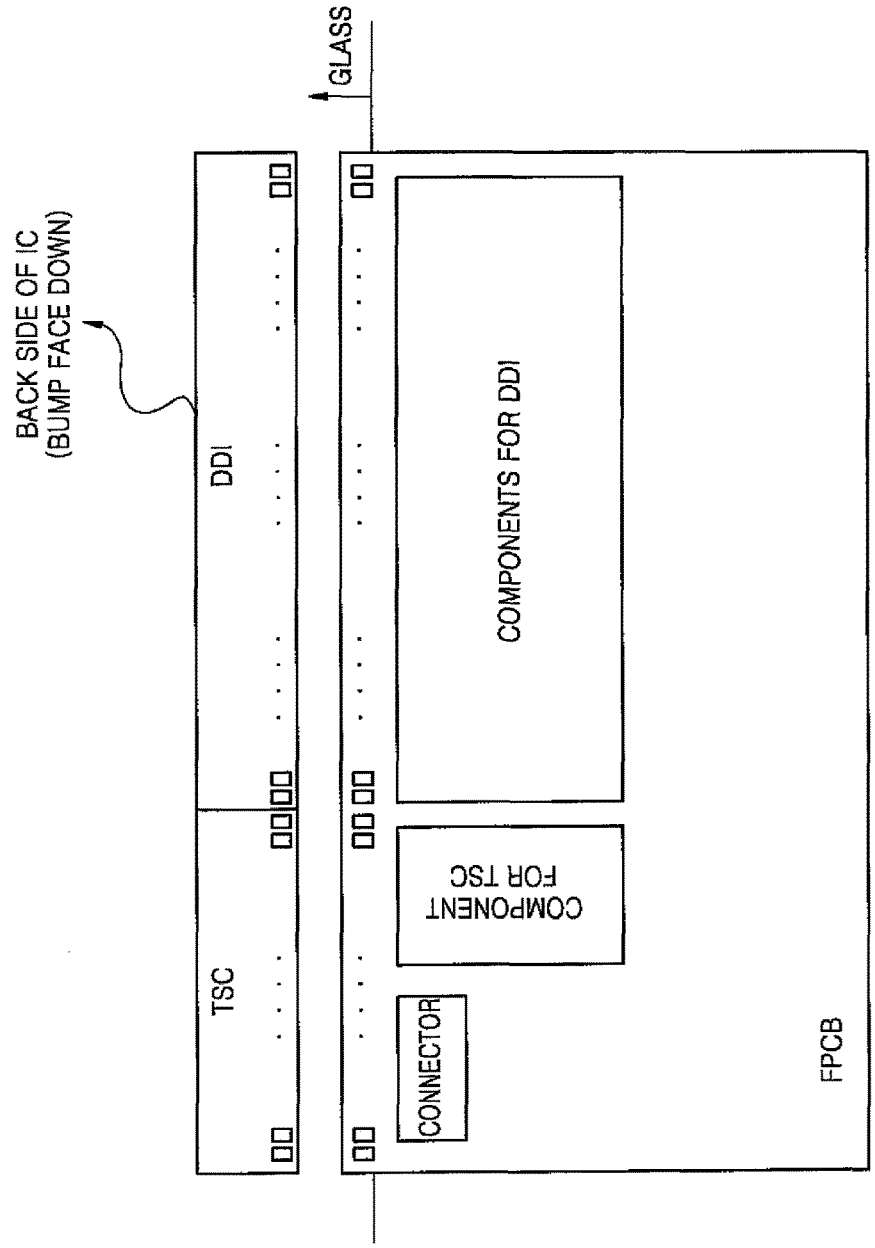
FIGS. 17A and 17B illustrate the structure of a semiconductor chip that includes a touch controller and a display driving circuit unit, and the structure of an FPCB according to embodiments of the inventive concept.
Figure 17B:
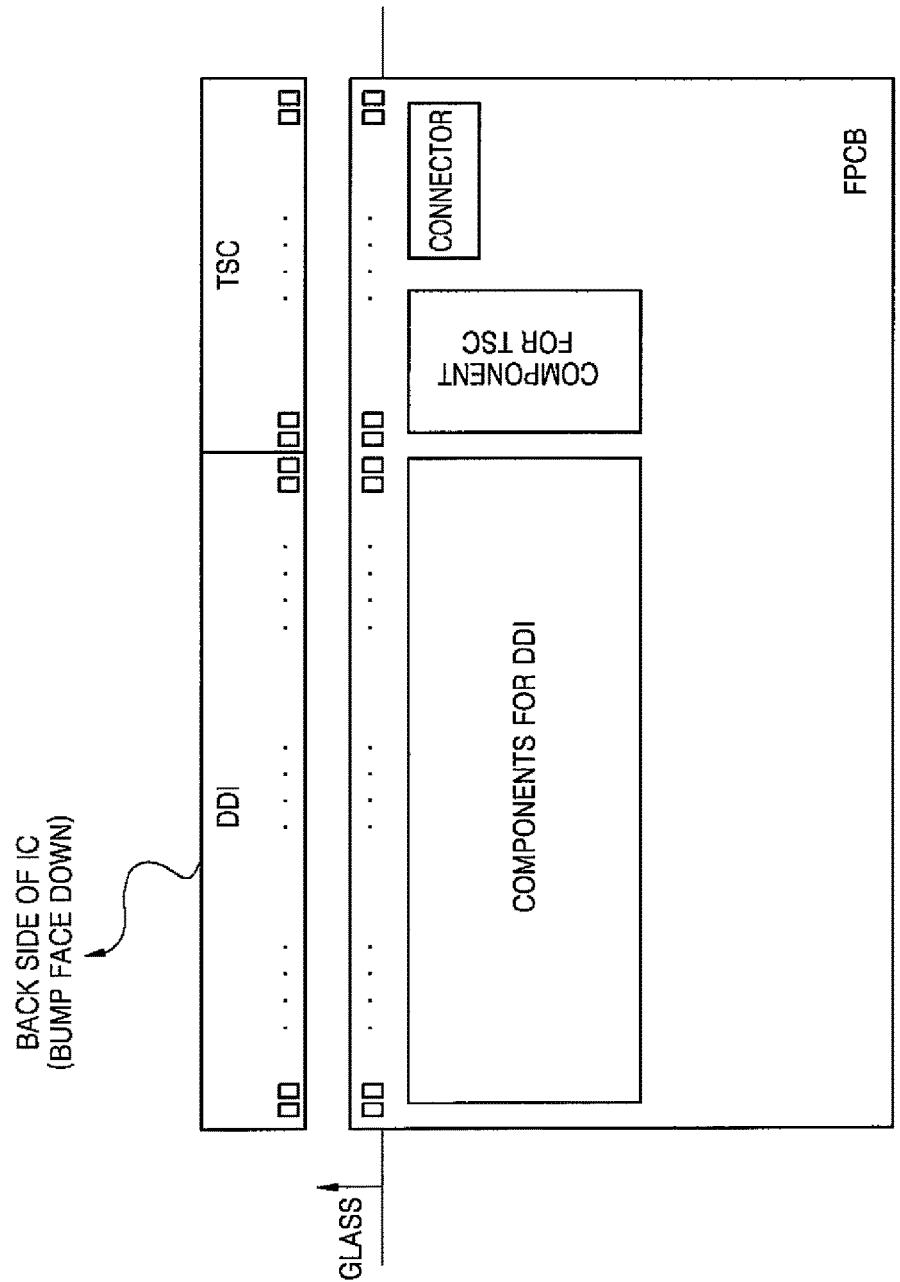

FIGS. 17A and 17B illustrate the structure of a semiconductor chip that includes a touch controller and a display driving circuit unit, and the structure of an FPCB according to embodiments of the inventive concept. The semiconductor chip includes pads for transmitting and receiving signals related to the touch controller and pads for transmitting and receiving signals related to the display driving circuit unit. The pads may be electrically connected to a touch panel, a display panel, and a host controller via connection terminals of the FPCB. When the semiconductor chip is fabricated, a region in which the touch controller is located may be separated apart from a region in which the display driving circuit unit is located. When the connection terminals are arranged in the FPCB, connection terminals connected to the signals related to the touch controller and connection terminals connected to the signals related to the display driving circuit unit may be disposed to correspond to the pads of the semiconductor chip.

Figure 18A:
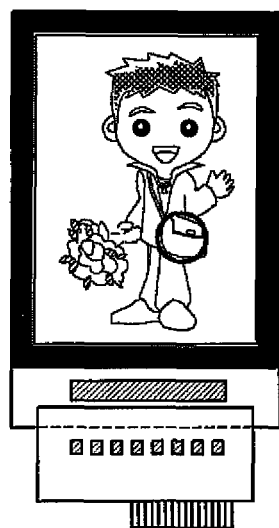
FIGS. 18A and 18B illustrate embodiments of a display device having a semiconductor chip in which a touch controller and a display driving circuit are included, according to the inventive concept.
Figure 18B:
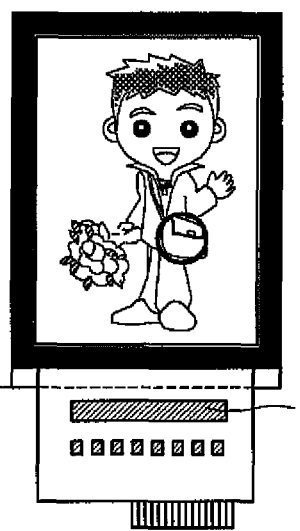

FIGS. 18A and 18B illustrate embodiments of a display device having a semiconductor chip in which a touch controller and a display driving circuit are included, according to the inventive concept. Specifically, FIG. 18A illustrates that the semiconductor chip is disposed on a glass plate of a display panel in the form of COG, and FIG. 18B illustrates that the semiconductor chip is disposed on a film of a display panel in the form of chip on film (COF). In general, when the touch controller and the display driving circuit are disposed on different chips, the touch controller may be disposed in the form of COF and the display driving circuit may be disposed in the form of COG, but in another embodiment according to the inventive concept, the semiconductor chip that includes the touch controller and the display driving circuit may have a COG or COF structure.

While the inventive concept has been particularly shown and described with reference to exemplary embodiments thereof, it will be understood that various changes in form and details may be made therein without departing from the spirit and scope of the following claims.

What is claimed is:

1. A touch display driver integrated chip (TDDI) comprising:
 a display driving unit comprising:
  a source driver configured to drive a source line of a display panel; and
  a timing controller configured to control the source driver; and
 a touch controller configured to detect an electrical change of sensing units of the display panel and to periodically check whether touching is made when the display driving unit enters a low-power consumption mode,
 wherein the display driving unit and the touch controller are included in a same semiconductor chip, and
 wherein the TDDI is configured to receive timing control information from a host controller.

2. The TDDI of claim 1, wherein an operation of the display driving unit and an operation of the touch controller are synchronized with each other.

3. The TDDI of claim 2, wherein the timing controller is configured to generate timing information and to transmit the timing information to the touch controller.

4. The TDDI of claim 2, wherein the display driving unit includes a power generator configured to generate a power voltage and to supply the power voltage to the touch controller.

5. The TDDI of claim 3, wherein the display driving unit is configured to generate the timing information based on the timing control information.

6. The TDDI of claim 5, wherein the touch controller is configured to generate a control signal in synchronization with the timing information and to control a timing of generating touch data using the control signal.

7. A touch display driver integrated chip (TDDI) comprising:
 a display driving unit comprising
  a source driver configured to drive a source line of a display panel; and
  a timing controller configured to control the source driver; and
 a touch controller configured to detect an electrical change of sensing units of the display panel and to periodically check whether touching is made when the display driving unit enters a low-power consumption mode,
 wherein an operation of the display driving unit and an operation of the touch controller are synchronized with each other, the timing controller is configured to generate timing information and to transmit the timing information to the touch controller, and the display driving unit is configured to receive an external signal from an external controller and to generate the timing information based on the external signal, and wherein the timing controller does not provide the timing information to the touch controller when the touch controller enters a sleep mode.

8. The TDDI of claim 7, wherein the display driving unit does not provide a power voltage to the touch controller when the touch controller enters the sleep mode.

9. A touch display driver integrated chip comprising:
a timing controller configured to control a timing of displaying an image to be displayed on a display panel; and
a touch controller configured to detect an electrical change of sensing units of the display panel based on timing information received from the timing controller, wherein the timing controller and the touch controller are included in a same semiconductor chip, and
wherein the timing controller does not provide the timing information to the touch controller when the touch controller enters a sleep mode.

10. The touch display driver integrated chip of claim 9, wherein the timing controller is configured to receive an external signal from an external controller and to generate the timing information based on the external signal.

11. The touch display driver integrated chip of claim 10, wherein the touch controller is configured to generate a control signal in synchronization with the timing information and to control a timing of generating touch data using the control signal.

12. The touch display driver integrated chip of claim 10, wherein the timing controller is configured to receive a sleep status signal from the touch controller.

* * * * *